(12) United States Patent
Itagaki et al.

(10) Patent No.: US 8,051,799 B2
(45) Date of Patent: Nov. 8, 2011

(54) OBJECT-PROCESSING APPARATUS CONTROLLING PRODUCTION OF PARTICLES IN ELECTRIC FIELD OR MAGNETIC FIELD

(75) Inventors: Yousuke Itagaki, Kawasaki (JP); Natsuko Ito, Kawasaki (JP); Fumihiko Uesugi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 618 days.

(21) Appl. No.: 11/769,919

(22) Filed: Jun. 28, 2007

(65) Prior Publication Data

US 2008/0041306 A1 Feb. 21, 2008

(30) Foreign Application Priority Data

Jun. 29, 2006 (JP) ................. 2006-180384

(51) Int. Cl.
 *B05C 11/00* (2006.01)
(52) U.S. Cl. ............... 118/665; 118/728; 118/723
(58) Field of Classification Search .......... 118/728, 118/723
 See application file for complete search history.

(56) References Cited

U.S. PATENT DOCUMENTS

| | | | | |
|---|---|---|---|---|
| 5,401,351 A | * | 3/1995 | Samukawa | 156/345.49 |
| 5,592,358 A | * | 1/1997 | Shamouilian et al. | 361/234 |
| 6,074,488 A | * | 6/2000 | Roderick et al. | 118/728 |
| 6,211,527 B1 | * | 4/2001 | Chandler | 250/492.2 |
| 2003/0003758 A1 | * | 1/2003 | Moriya et al. | 438/710 |
| 2005/0260420 A1 | * | 11/2005 | Collins et al. | 428/446 |

FOREIGN PATENT DOCUMENTS

| | | |
|---|---|---|
| JP | 07-335574 | 12/1995 |
| JP | 2003-68708 | 3/2003 |
| JP | 2005-101539 | 4/2005 |
| JP | 2005-310966 | 11/2005 |

OTHER PUBLICATIONS

Heywang, W., Journal of Materials Science, 1971, 6, 1214-1226.*
Peaton, S. J., Applied Surface Science, 1997, 117/118, 597-604.*
Melcher (Continuum Electromechanics. Cambridge, MA: MIT Press, 1981).*
Pearton (Pearton, S. J., Applied Surface Science, 1997, 117/118, 597-604).*
Ito et al., "Monitoring Production of Particles in Plasma Etching Apparatus," Clean Tech., vol. 14, No. 1, pp. 17-20 (Jan. 2004).
Japanese Office Action dated May 31, 2011 in corresponding Japanese Application No. 2006-180384 with English translation of the Office Action encircled by lines.

* cited by examiner

*Primary Examiner* — Dah-Wei D Yuan
*Assistant Examiner* — Albert Hilton
(74) *Attorney, Agent, or Firm* — Young & Thompson

(57) ABSTRACT

An apparatus includes a housing defining a chamber in which an electric field is generated, and an internal member provided in the chamber. At least one part of the internal member is formed of a dielectric material. A process is executed in the chamber so that a dielectric deposit is formed on the at least one part of the internal member. An $m_1(d\in_1/dm_1)$ value of the dielectric material and an $m_2(d\in_2/dm_2)$ value of the dielectric deposit are set so that production of particles from the deposit is properly controlled. The term $m_1$ is a mass density of the dielectric material, $\in_1$ is a permittivity of the dielectric material, $m_2$ is a mass density of the dielectric deposit, and $\in_2$ is a permittivity of the dielectric deposit.

20 Claims, 11 Drawing Sheets

OBJECT-PROCESSING APPARATUS CONTROLLING PRODUCTION OF PARTICLES IN ELECTRIC FIELD OR MAGNETIC FIELD

BACKGROUND OF THE INVENTION

1. Field of the Invention

The present invention relates to an apparatus which involves generation of an electric field or a magnetic filed, and more particularly relates to such an apparatus in which manufacture, measurement or examination is carried out in the electric field or the magnetic field so that all object to be manufactured, measured or examined can be protected from being contaminated with particles produced in the apparatus.

2. Description of the Related Art

As a representative apparatus which involves generation of an electric field or a magnetic field, there are a plasma etching apparatus, a chemical vapor deposition (CVD) apparatus, a plasma sputtering apparatus, a focused ion beam (FIB) apparatus, an electron beam (EB) exposure apparatus, an electron microscopic apparatus and so on.

For example, the plasma etching apparatus is used to process an object to manufacture electronic devices. When the electronic devices are semiconductor devices, the object may be a semiconductor wafer. Also, when the electronic devices are liquid crystal display (LCD) panels, the object may be a glass substrate.

The plasma etching apparatus includes a housing having a bottom wall section, a side wall section and a top wall section which define a processing chamber. The plasma etching apparatus also includes an object stage provided in the processing chamber, a lower electrode incorporated in the object stage, and an upper electrode provided in the processing chamber so as to oppose the lower electrode. Note that the lower and upper electrodes are usually coated with a suitable dielectric material so that dielectric layers are formed thereon.

In operation, the object to be processed is mounted on the object stage, and a suitable etching gas is introduced into the processing chamber while applying a radio frequency (RF) voltage between the lower and upper electrodes to generate a plasma in the processing chamber, whereby the object is subjected to a plasma etching process.

Generally, during the etching process, reaction products, which are derived from the etching gas and the materials of the object, are produced and deposited on various internal members such as the object stage, the lower and upper electrodes, the wall sections of the housing and so on, so that reaction product deposits are formed as dielectric deposits on the internal members.

When the dielectric deposits are peeled from the internal members, many particles are produced in the processing chamber so that the object may be contaminated with the particles, resulting in occurrence of defects in the manufactured electronic devices.

As disclosed in, for example, JP-2003-068708 A and JP-2005-101539 A, the peeling of the dielectric deposits may be caused due to the fact that the dielectric deposits exist in an electric field defined between the lower and upper electrodes.

In particular, as disclosed in JP-2003-068708 A and JP-2005-101539 A, when reaction product deposits or dielectric deposits formed on an internal member exist in the electric field, they are subjected to a force which is defined by the following equation:

$$F = \rho E - (1/2)E^2 \nabla \in + (1/2)\nabla[E^2 m(d\in/dm)]$$

wherein F is a force exerted on the dielectric deposits per unit volume, $\rho$ is a density of true electric charge of the dielectric deposits, E is an electric field generated between the lower and upper electrodes, m is a mass density of the dielectric deposits, and $\in$ is a permittivity of the dielectric deposits.

In the aforesaid equation, the first term "$\rho E$", represents a Coulomb force per unit volume, but the Coulomb force per unit volume can be ignored because the true electric charge density essentially does not exist in the dielectric deposits.

Also, the second term "$(1/2)E^2\nabla\in$" represents a Maxwell stress, and the third term "$(1/2)\nabla[E^2 m(d\in/dm)]$" represents a Helmholtz stress.

JP-2003-068708 A discloses that the production of the particles in the processing chamber can be suppressed by controlling the Maxwell stress and the Helmholtz stress.

On the other hand, JP-2005-101539 A is directed to a cleaning method for the processing chamber by utilizing the Maxwell stress. Namely, it is disclosed that the Maxwell stress can be utilized to effectively remove the dielectric deposits from the internal members.

SUMMARY OF THE INVENTION

The present inventors have discovered that the above-mentioned prior art technologies have problems to be solved as mentioned below.

The Maxwell stress acts on a boundary between the dielectric deposit and the corresponding internal member when the permittivity of the dielectric deposits is different from that of the internal member. Namely, when the permittivity of the dielectric deposits is smaller than that of the internal member, the Maxwell stress acts as a peeling force for peeling the dielectric deposit from the internal member. When the permittivity of the dielectric deposit is larger than that of the internal member, the Maxwell stress acts as a pressing force for pressing the dielectric deposit against the internal member.

Thus, JP-2003-068708 A discloses that the production of the particles can be suppressed by making the permittivity of the internal member coincide with that of the dielectric deposit, i.e., by forming the internal member of a material having substantially the same permittivity as that of the dielectric deposits, because the peeling force of the dielectric deposit from the internal member can be thus suppressed.

The Helmholtz stress causes changes in volume of both the dielectric deposit and the internal member, resulting in production of the particles from the dielectric deposit. In this regard, the Helmholtz stress is concerned with elastic coefficients of the dielectric deposit and the internal member, because both the dielectric deposit and the internal member are subjected to deformation due to the change of the volume thereof, and because the deformation depends on the elastic coefficients of both the dielectric deposit anti the internal member.

Thus, JP-2003-068708 A discloses that the production of the particles can be suppressed by making the elastic coefficient of the internal member coincide with that of the dielectric deposit, i.e.) by forming the internal member of a material having substantially the same elastic coefficient as that of the dielectric deposit.

Nevertheless, in reality, it is very difficult or impossible to properly control and suppress the production of the particles by making the elastic coefficient of the internal member coincide with that of the dielectric deposit. Namely, even if the respective elastic coefficients of the dielectric deposit and the internal member are made to coincide with each other, the respective Helmholtz stresses exerted on the dielectric deposit and the internal member cannot be made to be equal to each other, because the permittivities of the dielectric deposit and the internal member independently vary when being deformed due to the changes of the volumes of the dielectric deposit and the internal member.

Also, JP-2005-101539 A discloses that the Helmholtz stress may be ignored as a force exerted on the dielectric deposits. Nevertheless, as stated hereinafter, according to the inventors, experiments, it is presumed that the dielectric deposits are dominated by the Helmholtz stress rather than the Maxwell stress.

In any event, JP-2003-068708 A and JP-2005-101539 A fail to properly control the production of the particles in the processing chamber, as will be stated in detail hereinafter.

In accordance with a first aspect of the present invention, there is provided an apparatus which includes a housing defining a chamber in which an electric field is generated, and an internal member provided in the chamber, at least one part of the internal member being formed of a dielectric material. A process is executed in the chamber so that a dielectric deposit is formed on the at least one part of the internal member. An $m_1(d\in_1/dm_1)$ value of the dielectric material and an $m_2(d\in_2/dm_2)$ value of the dielectric deposit are set so that production of particles from the deposit is properly controlled. The term $m_1$ is a mass density of the dielectric material, $\in_1$ is a permittivity of the dielectric material, $m_2$ is a mass density of the dielectric deposit, and $\in_2$ is a permittivity of the dielectric deposit.

The $m_1(d\in_1/dm_1)$ value of the dielectric material may be substantially equal to the $m_2(d\in_2/dm_2)$ valve of the dielectric deposit. In this case, a difference between the $m_1(d\in_1/dm_1)$ value of the dielectric material end the $m_2(d\in_2/dm_2)$ value of the dielectric deposit should fall within a range of ±5%.

The $m_1(d\in_1/dm_1)$ value of the dielectric material may be larger than the $m_2(d\in_2/dm_2)$ value of the dielectric deposit. Otherwise, the $m_1(d\in_1/dm_1)$ value of the dielectric material may be smaller than the $m_2(d\in_2/dm_2)$ value of dielectric deposit.

For example, when the apparatus is constituted as either a plasma chemical vapor deposition apparatus or a focused ion beam apparatus, the $m_1(d\in_1/dm_1)$ value of the dielectric material should be substantially equal to the $m_2(d\in_2/dm_2)$ value of the dielectric deposit. In this case, the dielectric material may be either silicon dioxide ($SiO_2$) or yttrium aluminum garnet (YAG).

Also, when the apparatus is constituted as either a plasma etching apparatus or a thermal chemical vapor deposition apparatus, the $m_1(d\in_1/dm_1)$ value of the dielectric material should be smaller than the $m_2(d\in_2/dm_2)$ value of the dielectric deposit. In this case, the dielectric material may be one selected from the group consisting of yttrium aluminum garnet (YAG), barium titanate ($BaTiO_3$) and lead zirconate/titanate ($Pb(Zr,Ti)O_3$).

Further, when the apparatus is constituted as a plasma etching apparatus, and when the internal member is positioned beneath the plasma, the $m_1(d\in_1/dm_1)$ value of the dielectric material should be larger than the $m_2(d\in_2/dm_2)$ value of the dielectric deposit. In this case, the dielectric material may be one selected from the group consisting of titanium dioxide ($TiO_2$), potassium dihydrogenphosphate ($KH_2PO_4$) and barium zirconate ($BaZrO_3$).

Further, when the apparatus is constituted as an electron beam exposure apparatus, the $m_1(d\in_1/dm_1)$ value of the dielectric material should be larger than the $m_2(d\in_2/dm_2)$ value of the dielectric deposit. In this case, the dielectric material should be titanium dioxide ($TiO_2$).

When the dielectric deposit contains a plurality of components, the $m_2(d\in_2/dm_2)$ value of the dielectric deposit may be represented by that of a main one of the components. Otherwise, the $m_2(d\in_2/dm_2)$ value of the dielectric deposit may be represented by an average of those of the components.

In accordance with a second aspect of the present invention, there is provided an apparatus which includes a housing defining a chamber in which a magnetic field is generated, and an internal member provided in the chamber, at least one part of the internal member being formed of a magnetic material. A process is executed in the chamber so that a magnetic deposit is formed on the at least one part of the internal member. An $m_1(d\mu_1/dm_1)$ value of the magnetic material and an $m_2(d\mu_2/dm_2)$ value of the magnetic deposit are set so that production of particles from the magnetic deposit is properly controlled. The term $m_1$ is a mass density of the magnetic material, $\mu_1$ is a permeability of the magnetic material, $m_2$ is a mass density of the magnetic deposit, and $\mu_2$ is a permittivity of the magnetic deposit.

For example, when the apparatus is constituted as an electron microscopic apparatus, the $m_1(d\mu_1/dm_1)$ value of the magnetic material may be substantially equal to the $m_2(d\mu_2/dm_2)$ value of the magnetic deposit. In this case, a difference between the $m_1(d\mu_1/dm_1)$ value of the magnetic material and the $m_2(d\mu_2/dm_2)$ value of the magnetic deposit should falls within a range of ±5%.

When the apparatus is constituted as a magnetic-field assist type plasma etching apparatus, the $m_1(d\mu_1/dm_1)$ value of the magnetic material should be larger than the $m_2(d\mu_2/dm_2)$ value of the magnetic deposit.

When the apparatus is constituted as an electron cyclotron resonance type plasma etching apparatus, the $m_1(d\mu_1/dm_1)$ value of the magnetic material should be smaller than the $m_2(d\mu_2/dm_2)$ value of the magnetic deposit.

When the magnetic deposit contains a plurality of components, the $m_2(d\mu_2/dm_2)$ value of the magnetic deposit may be represented by that of a main one of the components. Otherwise, the $m_2(d\mu_2/dm_2)$ value of the magnetic deposit may be represented by an average of those of the components.

BRIEF DESCRIPTION OF THE DRAWINGS

The present invention will be more clearly understood from the description set forth below, with reference to the accompanying drawings, wherein.

DESCRIPTION OF THE PREFERRED EMBODIMENTS

Figure 1:
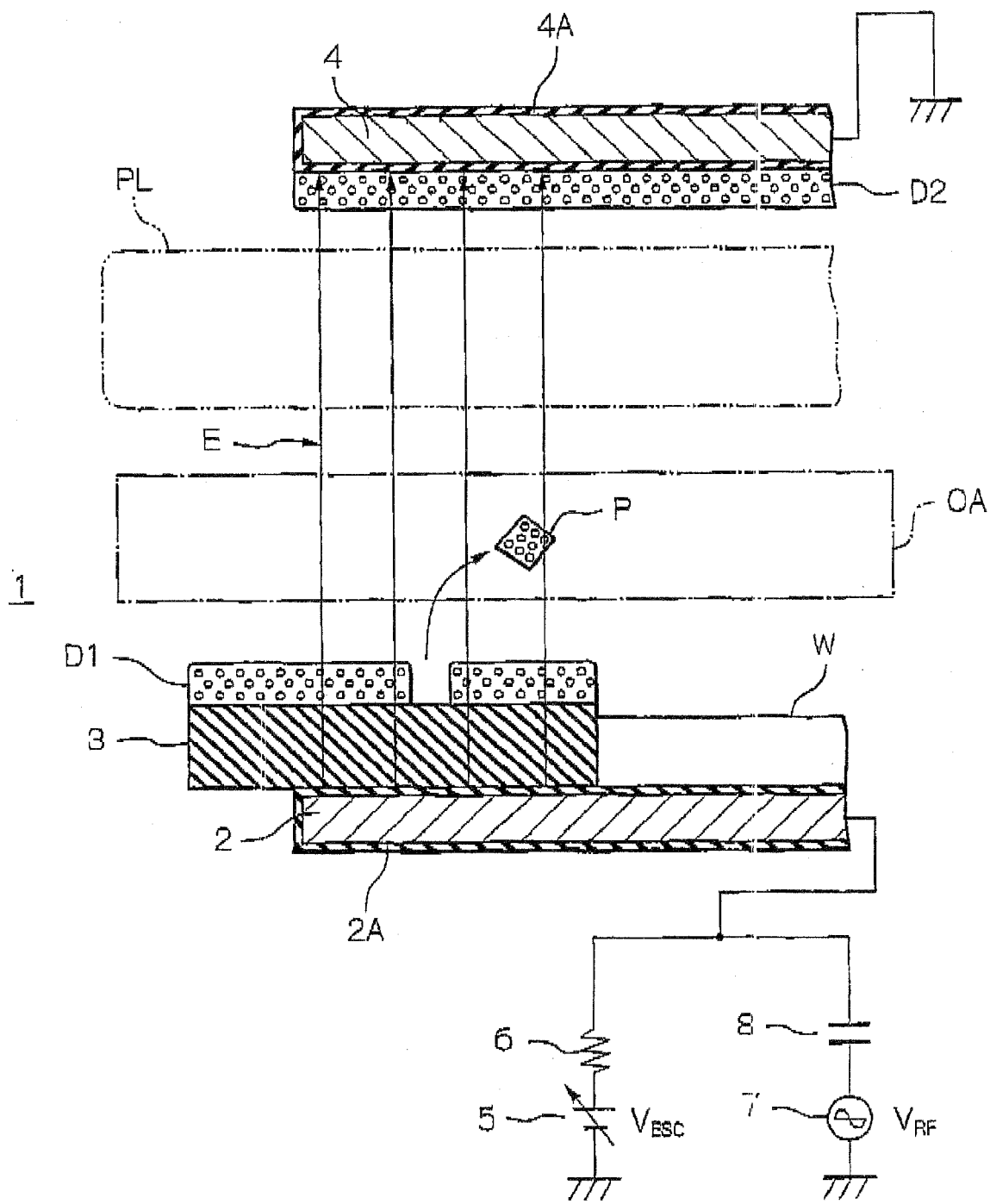
FIG. 1 is a cross-sectional view of a part of a cathode-coupled type plasma etching apparatus for explaining a principle of the present invention.
Figure 2A:
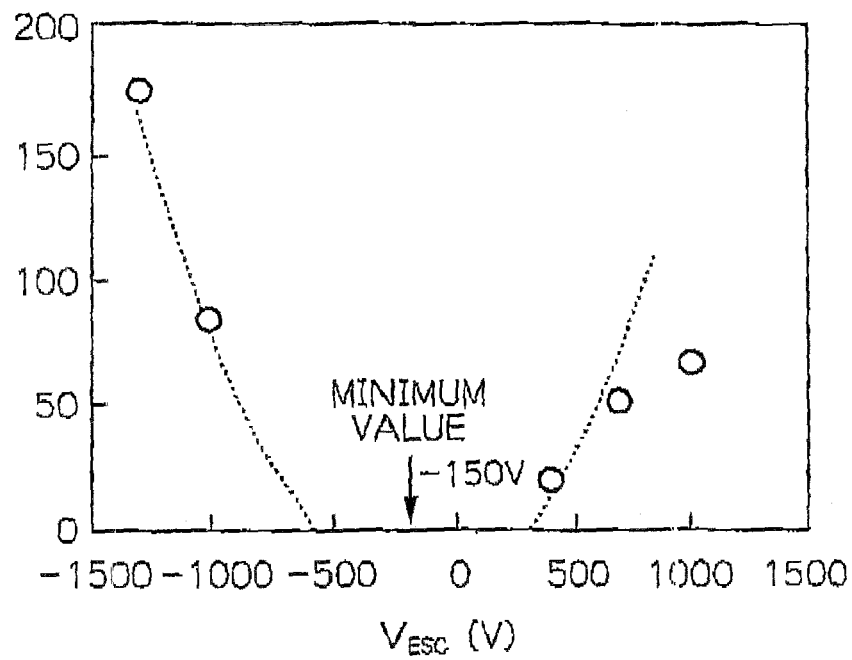
FIG. 2A is a graph showing a relationship between the electrostatic chuck (ESC) voltage and the number of particles produced in the cathode-coupled type plasma etching apparatus of FIG. 1.
Figure 2B:
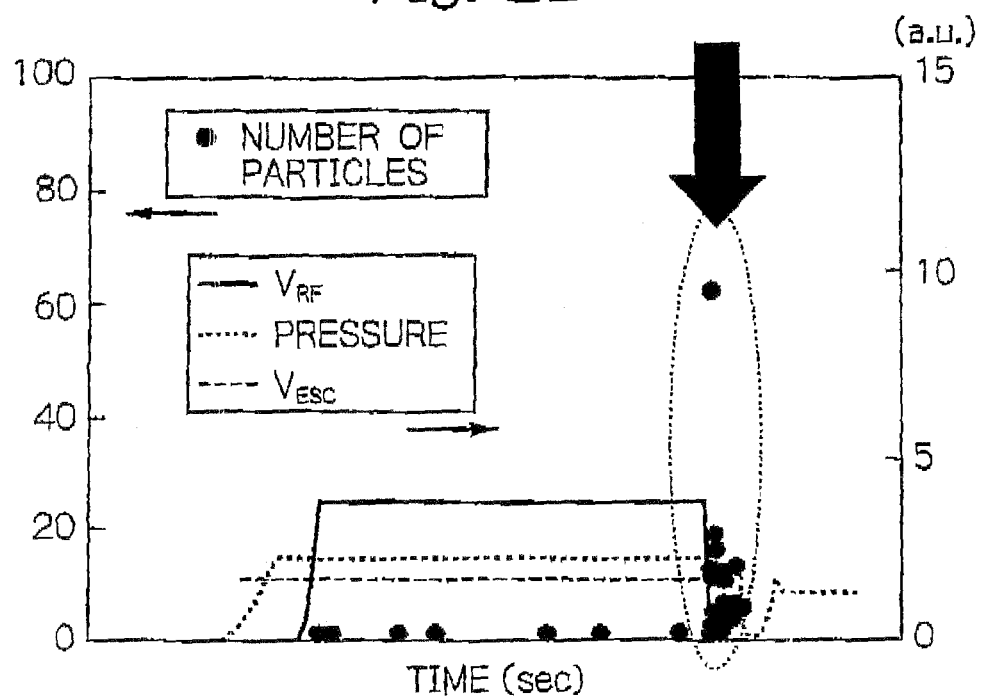
FIG. 2B is a graph showing how the particles are produced and behave in the cathode-coupled type plasma etching apparatus of FIG. 1.

With reference to FIG. 1 and FIGS. 2A and 2B, a principle of the present invention will now be explained by way of example below.

First, referring to FIG. 1 which is a schematic partial view of a cathode-coupled type plasma etching apparatus, reference 1 indicates a processing chamber of the plasma etching apparatus, 2 indicates a lower electrode provided in the processing chamber 1, 3 indicates a guide ring member securely mounted on the lower electrode 2 to position an object such as a silicon wafer W to be subjected to an plasma etching process in place on the lower electrode 2, and 4 indicates an upper electrode provided in the processing chamber 1 above the lower electrode 2.

Note that the guide ring member 3 is formed of a dielectric material such as ceramic. Also, note that the lower and upper electrodes 2 and 4 are coated with a dielectric material such as aluminum oxide ($Al_2O_3$), so that dielectric layers 2A and 4A are formed thereon.

The cathode-coupled type plasma etching apparatus of FIG. 1 is provided with a DC power source 5 which is connected to the lower electrode 2 through a resistor 6, and which applies an electrostatic chuck (ESC) voltage $V_{ESC}$ to the lower electrode 2 so that the silicon wafer W is electrostatically and tightly held by the lower electrode 2.

Also, the cathode-coupled type plasma etching apparatus of FIG. 1 is provided with an AC power source 7 which is connected to the lower electrode 2 through a capacitor 8, and which applies a radio frequency (RF) voltage $V_{RF}$ to the lower electrode 2 so that a plasma PL is generated between the lower and upper electrodes 2 and 4. During the generation of the plasma PL, the silicon wafer W captures electrons so that the lower electrode 2 with the silicon wafer W is negatively self-biased, with the lower and upper electrodes 2 and 4 serving as anode and cathode electrodes, respectively.

Note, in FIG. 1, reference E indicates an electric field generated between the lower and upper electrodes 2 and 4 due to both the ESC voltage $V_{ESC}$ and the self-biased voltage of the lower electrode 2 with the silicon wafer W.

For example, when the silicon wafer W has a metal layer formed of tungsten, titanium or the like to be subjected to a plasma etching process, a gas mixture containing fluorine gas and suitable additive gas may be used as an etching gas. In this case, reaction products such as tungsten fluoride or titanium fluoride are produced in the processing chamber 1, and are deposited on the guide ring member 3 and the dielectric layer 4A of the upper electrode 4, so that reaction product deposits or dielectric deposits D1 and D2 are formed on the top surface of the guide ring member 3 and the bottom surface of the dielectric layer 4A, respectively.

Note, in the example of FIG. 1, the permittivity of the dielectric deposits D1 and D2 is smaller than that of the guide ring member 3, and is smaller than that of the dielectric layer 4A.

As stated hereinbefore, during the plasma etching process carried out by the cathode-coupled type plasma etching apparatus of FIG. 1, each of the dielectric deposits D1 and D2 is subjected to a force which is defined by the following equation:

$$F = \rho E - (1/2)E^2 \nabla \in + (1/2) \nabla [E^2 m(d\in/dm)]$$

wherein F is a force exerted on the dielectric deposit D1 or D2 per unit volume, $\rho$ is a density of true electric charge of the dielectric deposit D1 or D2, E also indicates a strength of the electric field E defined between the lower and upper electrodes 2 or 4, m is a mass density of the dielectric deposit D1 or D2, and $\in$ is a permittivity of the dielectric deposit D1 or D2.

As already stated, in the aforesaid equation, the first term "$\rho E$" represents a Coulomb force per unit volume, but the Coulomb force per unit volume can be ignored because the true electric charge density is substantially zero in the dielectric deposit D1 or D2. On the other hand, the second term "$(1/2)E^2 \nabla \in$" represents a Maxwell stress, and the third term "$(1/2)\nabla[E^2 m(d\in/dm)]$" represents a Helmholtz stress.

Also, as stated hereinbefore, particles derived from the dielectric deposit D1 or D2 may be produced in the processing chamber 1 when the dielectric deposit D1 or D2 are peeled from the guide ring member 6 or the bottom surface of the dielectric layer 4A due to both the Maxwell stress and the Helmholtz stress.

The inventors actually searched and observed how the particles are produced and behave in the processing chamber 1 of the cathode-coupled type plasma etching apparatus of FIG. 1. Note, in FIG. 1, reference OA indicates an observation area which is predetermined to observe particles.

First, the application of the RF voltage $V_{RF}$ to the lower electrode 2 was carried out at 600 Watts to thereby generate the plasma PL. At this time, the lower electrode 2 no with the silicon wafer W exhibited a self-biased voltage falling within the range between −100 volts and −200 volts, and the plasma PL exhibited a plasma potential of about 10 volts.

During the generation of the plasma PI, it was observed that a major part of the particles have jumped out of the dielectric deposit D1 surrounding the silicon wafer W. Note that, in FIG. 1, only one of the jumped particles is representatively and conceptually indicated by reference P.

In short, the particles are subjected to a repelling force based on the Maxwell stress, due to the fact that the guide ring member 3 has a larger permittivity than that of the dielectric deposit D1.

Then, the inventors conducted experiments and research into the relationship between the ESC voltage $V_{RF}$ applied to the lower electrode 2 and the number of particles, by using the cathode-coupled type plasma etching apparatus of FIG. 1 in which fifty sample silicon wafers W were individually processed, with the ESC voltage $V_{ESC}$ varying within an excessively wide range from about −1250 to about +1000 volts.

FIG. 2A is a graph showing the experimental results. In this graph, the abscissa represents the ESC voltage $V_{ESC}$, and the ordinate represents the number of particles per the fifty silicon wafers W which were individually processed.

As shown in the graph of FIG. 2A, the number of particles varied in accordance with a curve a secondary degree having the minimum value at −150 volts. Namely, the number of particles was increased in proportion to the square value of the ESC voltage $V_{ESC}$. This proved that the particles were subjected to the repelling force based on the Maxwell stress, with the repelling force being in proportion to the square value of the electric field E.

On the other hand, it was observed how the particles behaved while individually processing twenty five sample silicon wafers W in the cathode-coupled type plasma etching apparatus of FIG. 1.

FIG. 2B is a graph showing the experimental results. In this graph, the abscissa represents the time; the left ordinate represents the number of particles; and the right ordinate represents the ESC voltage $V_{ESC}$ applied to the lower electrode 2, the pressure in the processing chamber 1, and the RF voltage $V_{RF}$ applied to the lower electrode 2. Note that the ESC voltage $V_{ESC}$ was set so that each of the sample silicon wafers W was suitably held by the lower electrode 2.

As shown in the graph of FIG. 2B, a small number of particles were produced and observed over a time period from a timing when the application of the RF voltage $V_{RF}$ was initiated to the lower electrode 2 to thereby generate a plasma PL between the lower and upper electrodes 2 and 4, to a timing when the application of the RF voltage was stopped so that the plasma PL disappeared.

Unexpectedly, as soon as the application of the RF voltage was stopped, i.e., as soon as the plasma PL disappeared, a large amount of particles derived from the dielectric deposit D2 deposited on the dielectric layer 4A of the upper electrode 4 was produced and observed, as indicated by the thickened solid arrow in the graph of FIG. 2B.

Although the reason why the large amount of particles was produced and observed when the plasma PL disappeared cannot be reasonably explained based on only the Maxwell stress, it is possible to reasonably explain the reason based on the Helmholtz, stress "$(1/2)\nabla[E^2 m(d\epsilon/dm)]$".

In particular, during the generation of the plasma PL, the Helmholtz stress causes changes in volume of both the dielectric layer 4A of the upper electrode 4 and the dielectric deposit D2, and the Helmholtz stress acts as a force pressing the dielectric deposit D2 against the dielectric layer 4A due to the fact that the permittivity of the dielectric layer 4A is larger than that of the dielectric deposit D2. When the volume of the dielectric layer 4A and the dielectric deposit D2 are changed, particles derived from the dielectric deposit D2 may be produced in the boundary therebetween, but these particles cannot be released in the processing chamber 1 due to the fact that the dielectric deposit D2 is pressed against the dielectric layer 4A. Nevertheless, when the application of the RF voltage $V_{RF}$ is stopped so that the plasma PL disappears, the force pressing the dielectric deposit D2 against the dielectric layer 4A is canceled, resulting in the release of the particles in the processing chamber 1.

In short, in the above-mentioned equation, since the first term "ρE" representing the Coulomb force per unit volume can be ignored, each of the dielectric deposits D1 and D2 are subjected to the force defined by the following equation.

$$F=(1/2)E^2[\nabla(m(d\epsilon/dm)-\nabla\epsilon]$$

In this equation, when the force F is positive, it acts as a force peeling the dielectric deposits D1 or D2 from the guide ring member 3 or the dielectric layer 4A. Also, when the force F is negative, it acts as a force pressing the dielectric deposits D1 or D2 against the guide ring member 3 or the dielectric layer 4A.

Further, the inventors conducted research regarding permittivities $\epsilon$ of various insulating materials, and values of $m(d\epsilon/dm)$ of the insulating materials were calculated. The results are shown in the following TABLE 1:

TABLE 1

| Material | Permittivity ϵ | m(dϵ/dm) |
|---|---|---|
| $Al_2O_3$ | $7.97 \times 10^{-11}$ | $-3.4 \times 10^{-10}$ |
| $Y_2O_3$ | $1.09 \times 10^{-10}$ | $-2.75 \times 10^{-10}$ |
| $SiO_2$ | $3.54 \times 10^{-11}$ | $-6.61 \times 10^{-10}$ |
| $TiO_2$ | $8.85 \times 10^{-10}$ | $3.51 \times 10^{-8}$ |
| YAG | $9.39 \times 10^{-11}$ | $-4.53 \times 10^{-9}$ |
| PTFE | $1.77 \times 10^{-11}$ | $5.9 \times 10^{-11}$ |
| siloxane | $2.21 \times 10^{-11}$ | $4.66 \times 10^{-11}$ |
| $Pb(Zr,Ti)O_3$ | $1.37 \times 10^{-8}$ | $-5.49 \times 10^{-7}$ |
| $TiF_4$ | $2.21 \times 10^{-11}$ | $2.10 \times 10^{-11}$ |

Note:
YAG is yttrium aluminum garnet ($Y_3Al_5O_{12}$); and PTFE is polytetrafluoroethylene.

As shown in TABLE 1, each of the $m(d\epsilon/dm)$ values is larger than the corresponding permittivity $\epsilon$. Thus, it is possible to presume that the reaction product deposits D1 and D2 are dominated by the Helmholtz stress rather than the Maxwell stress.

Thus, by suitably selecting an insulating material for the guide ring member 3, the dielectric 4A of the upper electrode 4 and so on, it is possible to properly control the production and/or the behavior of the particles in the processing chamber 1 so that the silicon wafer W can be prevented from being contaminated with the particles, as will be stated in detail hereinafter.

The same is true for a case where a magnetic deposit exists in an apparatus involving generation of a magnetic field, such as an electron microscopic apparatus, an electron cyclotron resonance (ECR) type plasma etching apparatus, a magnetic-field assist type plasma etching apparatus or the like. Namely, the magnetic deposit is subjected to a force F' by the following equation:

$$F'=(1/2)H^2[\nabla(m(d\mu/dm))-\nabla\mu]$$

wherein H is a strength of a magnetic field, and μ is a permeability of the magnetic deposit.

First Embodiment

Figure 3:
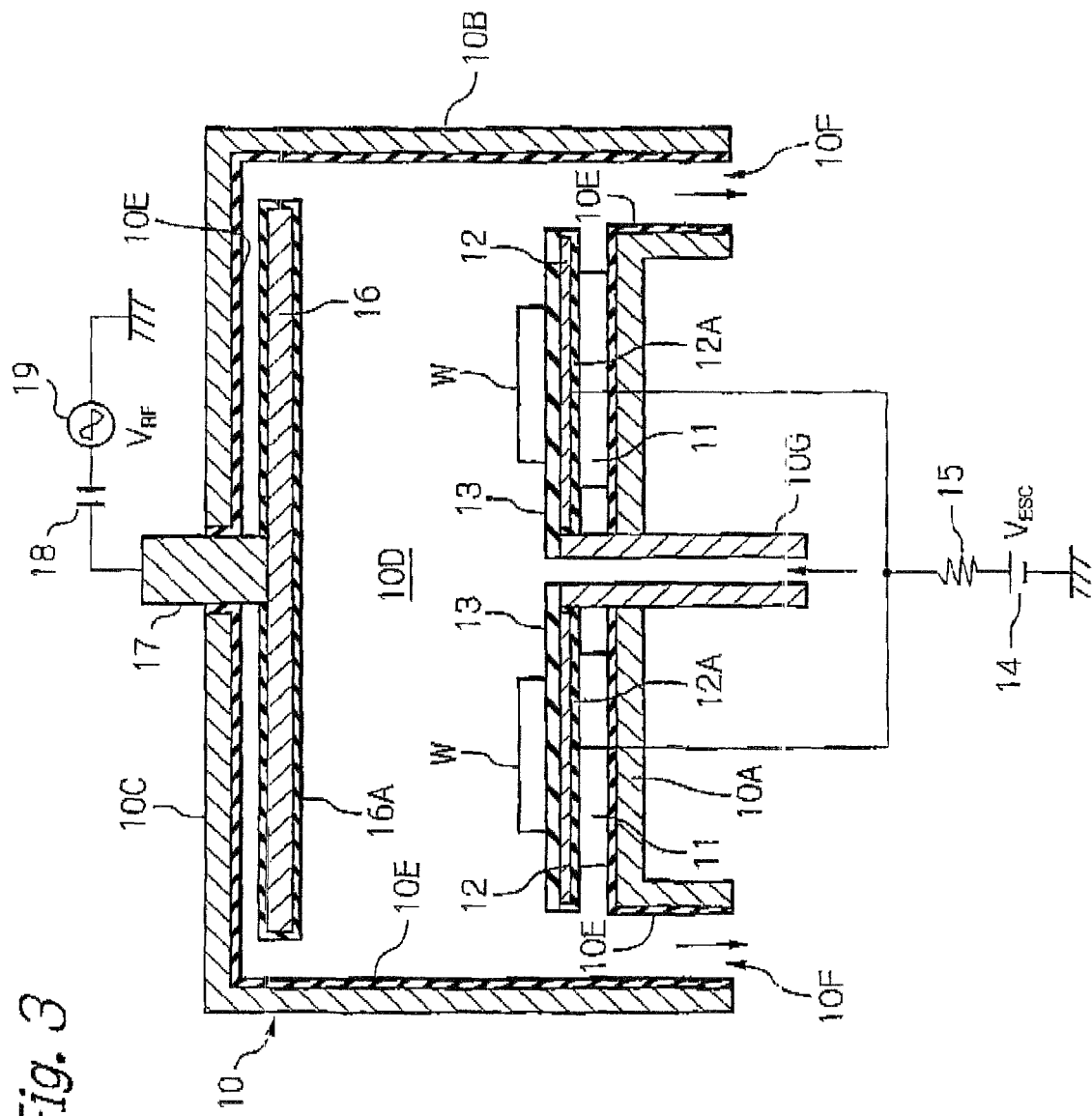
FIG. 3 is a schematic cross-sectional view of a first embodiment of the apparatus according to the present invention.

Firsts with reference to FIG. 3 which is a cross-sectional view of a first embodiment of the apparatus according to the present invention, the first embodiment is constituted as an anode-coupled type plasma CVD apparatus.

The anode-coupled type plasma CVD apparatus includes a housing 10 having a bottom wall section 10A, a side wall section 10B and a top wall section 10C which define a processing chamber 10D. The housing 10 itself is formed of a suitable metal material such as aluminum or the like, and the inner wall surfaces of the bottom, side aid top wall sections 10A, 10B and 10C of the housing 10 are coated with silicon dioxide ($SiO_2$) so that silicon dioxide layers 10E are formed thereon.

The housing 10 is provided with exhaust passages 10F formed in the bottom wall section 10A, and the exhaust passages 10F are in communication with a vacuum source not shown) so that a vacuum state is created in the processing chamber 10D.

Also, the housing 10 is provided with a gas supply conduit 10G connected to the bottom wall section 10A at the center thereof so as to be in communication with the processing chamber 10D. Although not illustrated, the gas supply conduit 10G is connected to a silane gas source and an oxygen gas source so that silane gas (SiH$_4$) and oxygen gas (O$_2$) are introduced into the processing chamber 10D.

The anode-coupled type plasma CVD apparatus of FIG. 3 also includes electric heaters 11 provided on the bottom wall section 10A around the gas supply conduit 10G, and lower electrodes 12 provided on the respective electric heaters 11. The lower electrodes themselves are formed of a suitable metal such as aluminum or the like, and both a bottom surface and a side surface of each of the lower electrodes 12 are coated with silicon dioxide (SiO$_2$) so that a silicon dioxide layer 12A is formed thereon.

The anode-coupled type plasma CVD apparatus of FIG. 3 further includes susceptors 13 provided on the respective lower electrodes 12, and each of the susceptors 13 is formed of silicon dioxide (SiO$_2$). Objects such as silicon wafers W to be processed are placed on the respective susceptors 13.

The anode-coupled type plasma CVD apparatus of FIG. 3 is provided with a DC power source 14 which is connected to the lower electrodes 12 through a resistor 15, and which applies an ESC voltage V$_{ESC}$ to the lower electrodes 12 so that the silicon wafers W are electrostatically and tightly held by the respective susceptors 13, whereby the silicon wafers W can be uniformly heated by the respective electric heaters 11.

The anode-coupled type plasma CVD apparatus of FIG. 3 further includes an upper electrode 16 which is suspended from the top wall section 10C of the housing 10 so as to oppose the lower electrodes 12. Namely, the upper electrode 16 is connected to a lower end of a conductive stem 17 which is securely set in the top wall section 10C. The upper electrode 16 is coated with silicon dioxide (SiO$_2$) so that a silicon dioxide layer 16A is formed thereon.

The anode-coupled type plasma CVD apparatus of FIG. 3 is provided with an AC power source 19 which is connected to the conductive stem 17 through a capacitor 18, and an RF voltage V$_{RF}$ is applied to the upper electrode 16 so that a plasma (not shown) is generated between the loiter electrodes 12 and the upper electrode 16. During the generation of the plasma, the silicon wafers W capture electrons so that the lower electrodes 12 with the silicon wafers W are negatively self-biased. Namely, the lower electrodes 12 with the silicon wafers W serve as cathode electrodes, and the upper electrode 16 serves as an anode electrode.

In operation, as stated above, silane gas (SiH$_4$) and oxygen gas (O$_2$) are introduced into the processing chamber 10D through the gas supply conduit 10G, and thus silicon dioxide substance is produced as a reaction product in the processing chamber 10D.

A part of the silicon dioxide substance, is deposited on the silicon loafers W so that silicon dioxide film layers are formed on the silicon wafers W.

Another part of the silicon dioxide substance is deposited on various internal members such as the lower electrodes 12, the susceptors 13, the upper electrode 16 and so on, so that silicon dioxide deposits are formed on the various internal members 12, 13 and 16.

Further, yet another part of the silicon dioxide substance is deposited on the dielectric layers 10E on the inner wall surfaces of the bottom, side and top wall sections 10A, 10B and 10C of the housing 10, so that silicon dioxide deposits are formed thereon.

Note, in this specification, each of the bottom, side and top wall sections 10A, 10B and 10C of the housing 10 is defined as an internal member.

In the first embodiment of FIG. 3, as stated above, the silicon dioxide layers 10E are formed on the inner wall surfaces of the bottom, side and top wall sections 10A, 10B and 10C of the housing 10. Also, the silicon dioxide layers 12A are formed on the lower electrodes 12, and the silicon dioxide layer 16A is formed on the upper electrode 16. On the other hand, the susceptors 13 themselves are formed of silicon dioxide (SiO$_2$). In short, a part (10A, 10B, 10C, 12 and 16) of the internal members is coated with silicon dioxide (SiO$_2$), and the other part (13) of the internal members is formed of silicon dioxide (SiO$_2$).

Thus, the silicon dioxide deposits deposited on the internal members cannot be prevented from being peeled from the internal members. This is because the silicon dioxide deposits cannot be subjected to a force peeling the silicon dioxide deposits from the internal members due to the fact that the m(d∈/dm) value of the silicon dioxide deposits coincides with that of the silicon dioxide layers 10E, 12A and 16B and with that of the susceptors 13. Thus, it is possible to considerably suppress production of particles deriving from the silicon dioxide deposits, resulting in protection of the silicon wafers W from being contaminated with the particles.

In the first embodiment of FIG. 3, for example, the housing 10 itself is preferably formed of aluminum exhibiting a superior thermal conductivity. Also, the silicon dioxide layers 10E may be formed by using a sputtering process. In this case, it is possible to easily control a process temperature during an execution of the CVD process, due to the superior thermal, conductivity of the housing 10.

Furthermore, in the first embodiment of FIG. 3, the inner wall surfaces of the bottom, side and top wall sections 10A, 10B and 10C may be coated with another dielectric material such as yttrium aluminum garnet (YAG) exhibiting an m(d∈/dm) value smaller than that of silicon dioxide or the like. In this case, the coating of YAG is carried out by using a flame spray coating process so that porous YAG layers having a 50% porosity are formed on the inner wall surfaces of the bottom, side and top wall sections 10A, 10B and 10C. Each of the porous YAG layers having the 50% porosity exhibits the m(d∈/dm) value which is virtually equal to that of silicon dioxide. Note that the same is true for each of the silicon dioxide layers 12A and 16A of the lower and upper electrodes 12 and 16.

Also, the inner wall surfaces of the bottom, side and top wall sections 10A, 10B and 10C may be coated with a mixture of at least two kinds of dielectric materials except for silicon dioxide. In this case, of course, the mixture should be prepared so as to exhibit an m(d∈/dm) value which is substantially equal that of silicon dioxide. If a difference between the m(d∈/dm) value of the mixture and the m(d∈/dm) value of silicon dioxide falls within a range of ±5%, both the m(d∈/dm) values can be regarded as being substantially equal to each other, so that it is possible to effectively suppress the production of particles. Note that the same is true for each of the silicon dioxide layers 12A and 16A of the lower and upper electrodes 12 and 16.

Second Embodiment

Figure 4:
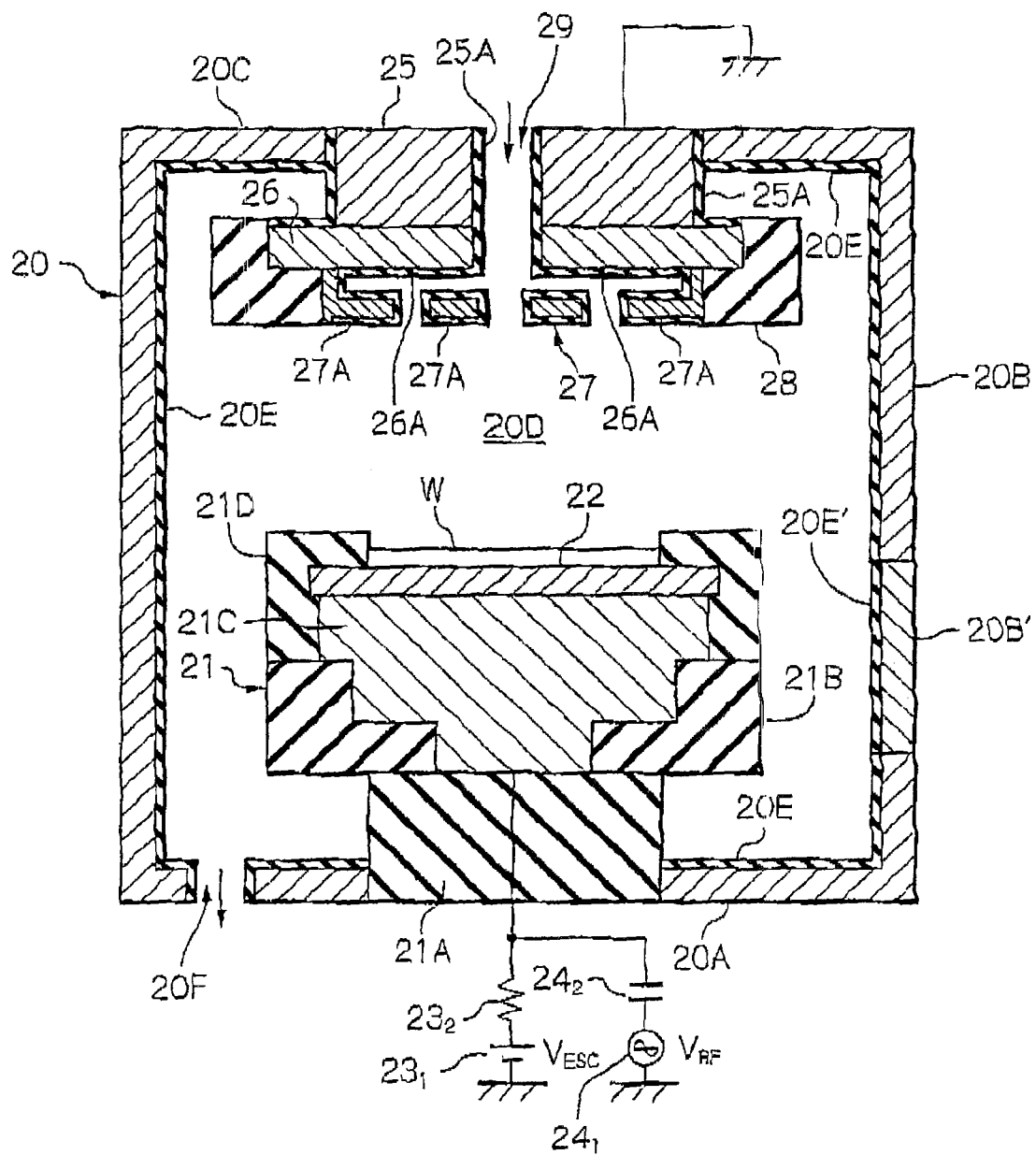
FIG. 4 is a schematic cross-sectional view of a second embodiment of the apparatus according to the present invention.

With reference to FIG. 4 which is a cross-sectional view of a second embodiment of the apparatus according to the present inventions the second embodiment is constituted as a cathode-coupled type plasma etching apparatus.

The cathode-coupled type plasma etching apparatus includes a housing 20 having a bottom wall section 20A, a side wall section 20B and a top wall section 20C which define a processing chamber 20D. The housing 20 itself is formed of a suitable metal material such as aluminum or the like, and the inner wall surfaces of the bottom, side and top wall sections 20A, 20B and 20C of the housing 20 are coated with a suitable dielectric material such as YAG, barium titanate (BaTiO$_3$), lead zirconate/titanate (Pb(Zr,Ti)O$_3$) or the like, so that dielectric layers 20E are formed thereon.

The side wall section 20B is provided with a gate valve 20B' which is openable for introducing an object such as a silicon wafer W to be processed into the processing chamber 20D and for taking out the same from the processing chamber 20D. An inner wall surface of the gate valve 20B, is also coated with the aforesaid dielectric material such as YAG, barium titanate (BaTiO$_3$), lead zirconate/titanate (Pb(Zr,Ti)O$_3$) or the like, so that a dielectric layer 20E' is formed thereon.

Note, in this second embodiment, the silicon wafer W has a multi-layered metal film layer structure to be etched, and the multi-layered metal film layer structure includes a titanium (Ti) film layer formed on the silicon wafer W, and a tungsten (W) film layer formed on the titanium (Ti) film layer.

The housing 20 is provided with an exhaust passage 20F formed in the bottom wall 20A, and the exhaust passage 20F is in communication with a vacuum source (not shown) so that a vacuum state is created in the processing chamber 20D.

Also, the cathode-coupled type plasma etching apparatus of FIG. 4 includes an object-stage unit 21 provided in the bottom wall section 20A, and a lower electrode 22 incorporated in the object-stage unit 21, and the silicon wafer W to be processed is placed on the lower electrode 22.

In particular, the object-stage unit 21 has a base member 21A set in the bottom wall section 20A, a cup-like member 21B securely mounted on the base member 21A, a conductive member 21C received in the cup-like member 21B, and a ring-like member 21D securely mounted on the cup-like member 21D so as to surround an upper portion of the conductive member 21C. The lower electrode 22 is provided on the conductive member 21C, and is retained by the ring-like member 21D. The ring-like member 21D serves as a guide ring member for positioning the silicon wafer W in place on the lower electrode 22.

The base member 21A, the cup-like member 21B and the ring-like member 21D are formed of the aforesaid dielectric material such as YAG, barium titanate (BaTiO$_3$), lead zirconate/titanate (Pb(Zr,Ti)O$_3$) or the like, and the conductive member 21B is formed of a suitable metal material such as aluminum or the like.

The cathode-coupled type plasma etching apparatus of FIG. 4 is provided with a DC power source $23_1$ which is connected to the conductive member 21C through a resistor $23_2$ so that an ESC voltage $V_{ESC}$ is applied to the lower electrode 22 through the conductive member 21C, whereby the silicon wafer W is electrostatically and tightly held by the lower electrode 22.

Also, the cathode-coupled type plasma etching apparatus of FIG. 4 is provided with an AC power source $24_1$ which is connected to the conductive member 21C through a capacitor $24_2$, and an RF voltage $V_{RF}$ is applied to the lower electrode 22.

The cathode-coupled type plasma etching apparatus of FIG. 4 further includes a conductive plug-like member 25 set in the top wall section 20C of the housing 20, an upper electrode 26 securely attached to the lower end face of the conductive plug-like member 25, a gas plate 27 electrically and securely connected to the upper electrode 26, and a ring-like member 28 securely attached to the peripheral sides of both the upper electrode 26 and the gas plate 27.

The upper electrode 26 is grounded through the plug-like conductive member 25, and thus a plasma (not shown) is generated between the lower and upper electrodes 22 and 26 when applying the RF voltage $V_{RF}$ to the lower electrode 22.

At this time, the lower and upper electrodes 22 and 26 serve as cathode and anode electrodes, respectively.

Both the plug-like member 25 and the upper electrode 26 are formed with a gas supply passage 29 at the centers thereof, and a gas mixture containing sulfur hexafluoride gas and suitable additive gas is introduced as an etching gas into the processing chamber 20D through the gas supply passage 29.

The plug-like member 25, the upper electrode 26 and the gas plate 27 are formed of a suitable metal material such as aluminum or the like, and are coated with the aforesaid dielectric material such as YAG, barium titanate (BaTiO$_3$), lead zirconate/titanate (Pb(Zr,Ti)O$_3$) or the like, so that dielectric layers 25A, 26A and 27A are formed thereon, whereby the metal surfaces of the plug-like member 25, the upper electrode 26 and the gas plate 27 are prevented from being directly exposed.

The ring-like member 28 is formed of the aforesaid dielectric material such as YAG, barium titanate (BaTiO$_3$), lead zirconate/titanate (Pb(Zr,Ti)O$_3$) or the like.

In the cathode-coupled type plasma etching apparatus of FIG. 4, when the multi-layered metal film layer structure on the silicon wafer W, which includes the titanium (Ti) film layer and the tungsten (W) film layer formed thereon, is subjected to a plasma etching process by using the etching gas containing the sulfur hexafluoride gas and the suitable additive gas, reaction products such as tungsten fluoride (WF$_6$), titanium fluoride (TiF$_3$, TiF$_4$), titanium dioxide (TiO$_2$), sulfur (S) and so on are produced. At this time, since tungsten fluoride (WF$_6$) exhibits a low boiling plaints (16.9° C.) it is discharged from the processing chamber 20D through the exhaust passage 20F. Namely, the reaction products except for tungsten fluoride (WF$_6$) are left as dielectric substances in the processing chamber 20D.

A part of the dielectric substances is deposited on various internal members such as the base member 21A, the cup-like member 21B, the ring-like member 21D, the conductive plug-like member 25, the upper electrode 26, the gas plate 27 and the ring-like member 28, so that dielectric deposits are formed on the various internal members.

Further, another part of the various dielectric substances is deposited on the dielectric layers 20E on the inner wall surfaces of the bottom, side and top wall sections 20A, 20B and 20C of the housing 20, so that dielectric deposits are formed on the bottom, side and top wall sections 10A, 10B and 10C.

Note, similar to the case of the above-mentioned first embodiment of FIG. 3, in this specification, each of the bottom, side and top wall sections 20A, 20B and 20C of the housing 20 is defined as an internal member. Also, note that titanium fluoride (TiF$_3$) forms a main component of the dielectric deposits formed on the internal members.

In the second embodiment of FIG. 4, the aforesaid dielectric material such as YAG, barium titanate (BaTiO$_3$), lead zirconate/titanate (Pb(Zr,Ti)O$_3$) or the like is selected so as to have a smaller m(d∈/dm) value than that of the dielectric deposits formed on the internal members.

Thus, during the etching process, i.e., during the generation of the plasma, the dielectric deposits are subjected to forces peeling them from the internal members, so that particles are produced in the processing chamber 20D. Nevertheless, the silicon wafer W is protected from being contaminated with the particles because the particles are positively charged so as to be repelled by the plasma having the positive potential. Namely, the particles are discharged from the processing chamber 20D through the exhaust passage 20F without they reaching the silicon wafer W.

Accordingly, when the generation of the plasma is stopped, there are substantially no particles in the processing chamber 20D. Namely, during the etching process, since the particles are actively produced and discharged from the processing chamber 20D, there are almost no particles in the processing chamber 20D when the generation of the plasma is stopped. Also, the peeling force disappears upon stopping the generation of the plasma, so that the production of the particles is effectively suppressed.

In a prior art cathode-coupled plasma etching apparatus (see; Natsuko ITO et al. "MONITORING PRODUCTION OF PARTICLES IN PLASMA ETCHING APPARATUS", Clean Technology, January 2004, Vol. 14, No. 1, p 17-20, published by K.K. T & C TECHNICAL), it is reported how particles behave in a cathode-coupled type plasma etching apparatus (see: FIGS. 5(a) and 5(b) on page 19). In particular, particles, which are produced in a processing chamber during generation of a plasma, are discharged from the processing chamber through an exhaust passage thereof, for the same reason as stated above (see: FIG. 5(a)). However, as soon as the generation of the plasma is stopped, the particles are attracted to a negatively self-biased silicon wafer (see: FIG. 5(b)). This means that the production of the particles is not controlled in the processing chamber.

In the second embodiment of FIG. 4, preferably, the m(d∈/dm) value of the dielectric deposits is calculated based on a permittivity and an expansion coefficient of the dielectric deposits actually measured. Nevertheless, the m(d∈/dm) value of the dielectric deposits may be represented by an (d∈/dm) value of the main component (titanium fluoride ($TiF_3$) or tungsten fluoride ($WF_3$)) of the dielectric deposits. Otherwise, the m(d∈/dm) value of the dielectric deposits may be represented by an average of m(d∈/dm) values of some components of the dielectric deposits.

In the second embodiment of FIG. 4, during the etching process, since the particles are actively produced and discharged from the processing chamber 20D, growth of the dielectric deposits is suppressed so that it is possible to postpone periodic maintenance for cleaning the cathode-coupled type plasma etching apparatus.

Third Embodiment

Figure 5:
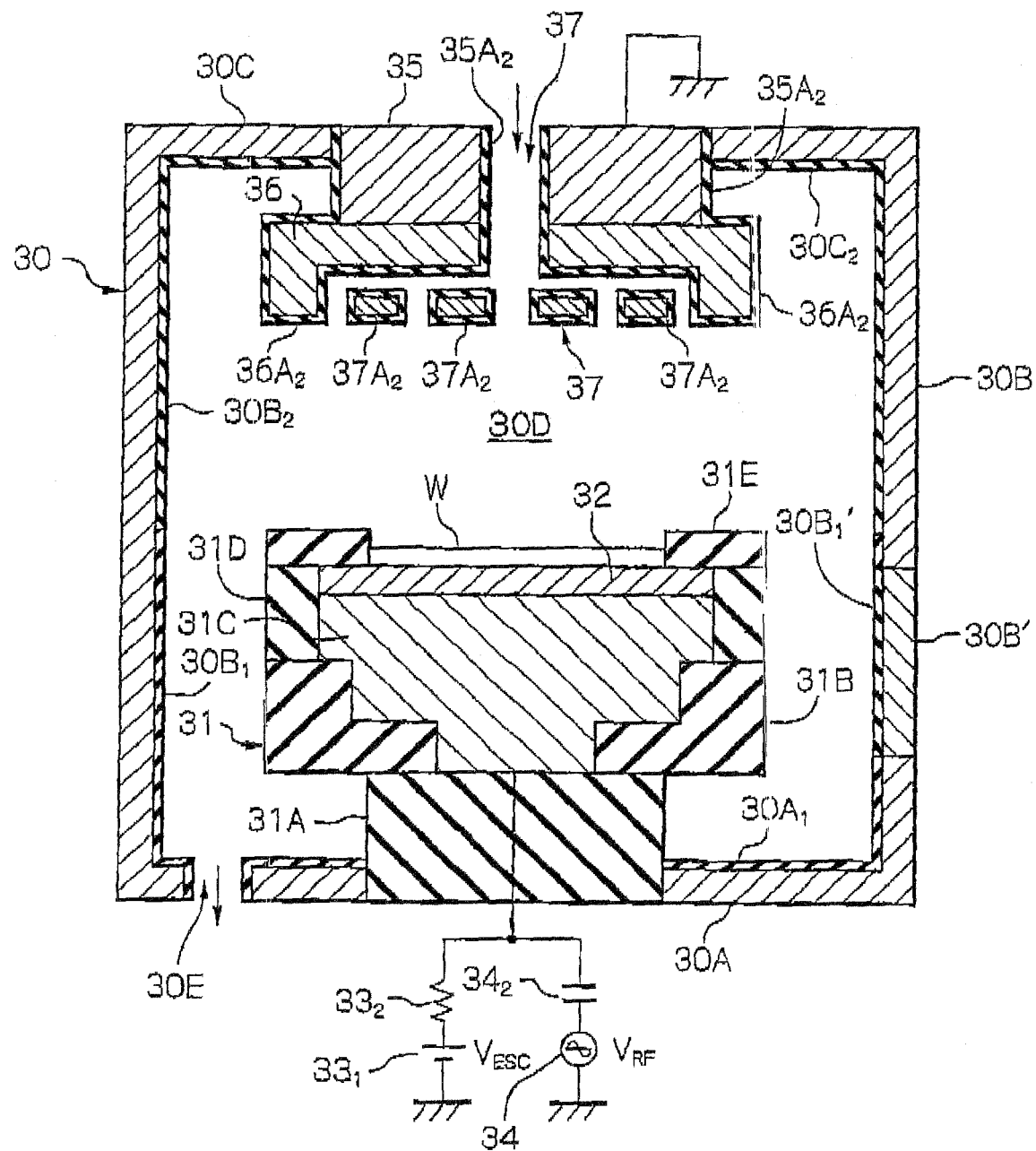
FIG. 5 is a schematic cross-sectional view of a third embodiment of the apparatus according tee the present invention.

With reference to FIG. 5 which is a cross-sectional view of a third embodiment of the apparatus according to the present invention, the third embodiment is also constituted as a cathode-coupled type plasma etching apparatus.

The cathode-coupled type plasma etching apparatus includes a housing 30 having a bottom wall section 30A, a side wall section 30B and a top wall section 30C which define a processing chamber 30D. The housing 30 itself is formed of a suitable metal material such as aluminum or the like.

The inner surface of the bottom wall section 30A is coated with a first type dielectric material such as titanium dioxide ($TiO_2$), potassium dihydrogenphosphate ($KH_2PO_4$), barium zirconate ($PbZrO_3$) or the like, so that a dielectric layer $30A_1$ is formed thereon. Also, a lower area of the inner surface of the side wall section 30B is also coated with the aforesaid first type dielectric material such as titanium dioxide ($TiO_2$), potassium dihydrogenphosphate ($KH_2PO_4$), barium zirconate ($PbZrO_3$) or the like, so that a dielectric layer $30B_1$ is formed thereon.

On the other hand, an upper area of the inner surface of the side wall section 30B is coated with a second type dielectric material such as YAG, barium titanate ($BaTiO_3$), lead zirconate/titanate ($Pb(Zr,Ti)O_3$) or the like, so that a dielectric layer $30B_2$ is formed thereon. The inner surface of the top wall section 30C is also coated with the aforesaid type second dielectric material such as YAG, barium titanate ($BaTiO_3$), lead zirconate/titanate ($Pb(Zr,Ti)O_3$) or the like, so that a dielectric layer $30C_2$ is formed thereon.

The side wall section 30B is provided with a gate valve 30B' which is openable for introducing an object such as a silicon wafer W to be processed into the processing chamber 30D and for taking out the same from the processing chamber 30D. An inner wall surface of the gate valve 30B' is coated with the aforesaid first type dielectric material such as titanium dioxide ($TiO_2$), potassium dihydrogenphosphate ($KH_2PO_4$), barium zirconate ($PbZrO_3$) or the like, so that a dielectric layer $30B_1$' is formed thereon.

Note, similar to the above-mentioned second embodiment, the silicon wafer W has a multi-layered metal film layer structure to be etched, and the multi-layered metal film layer structure includes a titanium (Ti) film layer formed on the silicon wafer W, and a tungsten (W) film layer formed on the titanium (Ti) film layer.

The housing 30 is provided with an exhaust port 30E formed in the bottom wall section 30A, and the exhaust port 30E is in communication with a vacuum source (not shown) so that a vacuum state is created in the processing chamber 30D.

Also, the cathode-coupled type plasma etching apparatus of FIG. 5 includes an object-stage unit 31 provided in the bottom wall section 30A, and a lower electrode 32 incorporated in the object-stage unit 31, and the silicon wafer W to be processed is placed on the lower electrode 32.

In particular, the object-stage unit 31 has a base member 31A set in the bottom wall section $30A_1$ a cup-like member 31B securely mounted on the base member 31A, a conductive member 31C received in the cup-like member 31B, a ring-like member 31D securely mounted on the cup-like member 31D so as to surround an upper portion of the conductive member 31C, and a guide ring member 31E securely mounted on the ring-like member 31D. The lower electrode 32 is provided on the conductive member 31C, and is retained by the guide ring member 31E to thereby position the silicon wafer W in place on the lower electrode 32.

The base member 31A, the cup-like member 31B, the ring-like member 31D and the guide ring member 31E are formed of the aforesaid second type dielectric material such as dielectric material such as titanium dioxide ($TiO_2$), potassium dihydrogenphosphate ($KH_2PO_4$), barium zirconate ($PbZrO_3$) or the like, and the conductive member 31B is formed of a suitable metal material such as aluminum or the like.

The cathode-coupled type plasma etching apparatus of FIG. 5 is provided with a DC power source $33_1$ which is connected to the conductive member 31C through a resistor $33_2$ so that an ESC voltage $V_{ESC}$ is applied to the lower electrode 32 through the conductive member 31C, whereby the silicon wafer W is electrostatically and tightly held by the lower electrode 32.

Also, the cathode-coupled type plasma etching apparatus of FIG. 5 is provided with an AC power source $34_1$ which is connected to the conductive member 31C through a capacitor $34_2$, and an RF voltage $V_{RF}$ is applied to the lower electrode 32.

The cathode-coupled type plasma etching apparatus of FIG. 5 further includes a conductive plug-like member 35 set in the top wall section 30C of the housing $30_1$ an upper electrode 36 securely attached to the lower end face of the conductive plug-like member 35, and a gas plate 37 electrically and securely connected to the upper electrode 36.

The upper electrode 36 is grounded through the plug-like conductive member 35, and thus a plasma (not shown) is generated between the lower and upper electrodes 32 and 36 when applying the RF voltage $V_{RF}$ to the lower electrode 32. At this time, the lower and upper electrodes 32 and 36 serve as cathode and anode electrodes, respectively.

Both the plug-like member 35 and the upper electrode 36 are formed with a gas supply passage 38 at the centers thereof, and a gas mixture containing sulfur hexafluoride gas and suitable additive gas is introduced as an etching gas into the processing chamber 30D through the gas supply passage 38.

The plug-like member 35, the upper electrode 36 and the gas plate 37 are formed of a suitable metal material such as aluminum or the like, and are also coated with the aforesaid second type dielectric material such as YAG, barium titanate ($BaTiO_3$), lead zirconate/titanate ($Pb(Zr,Ti)O_3$) or the like, so that dielectric layers $35A_2$, $36A_2$ and $37A_2$ are formed thereon, whereby the metal surfaces of the plug-like member 35, the upper electrode 36 and the gas plate 37 are prevented from being directly exposed.

Similar to the above-mentioned second embodiment of FIG. 4, in the cathode-coupled type plasma etching apparatus of FIG. 5, when the multi-layered metal film layer structure on the silicon wafer W, which includes the titanium (Ti) film layer and the tungsten (W) film layer formed thereon, is subjected to a plasma etching process by using the etching gas containing the sulfur hexafluoride gas and the suitable additive gas, reaction products such as tungsten fluoride ($WF_6$), titanium fluoride ($TiF_3$, $TiF_4$), titanium dioxide ($TiO_2$), sulfur (S) and so on are produced. As stated above, since tungsten fluoride ($WF_6$) exhibits a low boiling points (16.9° C.), it is discharged from the processing chamber 20D through the exhaust passage 20F. Namely, the reaction products except for tungsten fluoride ($WF_6$) are left as dielectric substances in the processing chamber 20D.

A part of the dielectric substances is deposited on the various internal members such as the base member 31A, the cup-like member 31B, the ring-like member 31D, the guide ring member 31E, the conductive plug-like member 35, the upper electrode 36 and the gas plate 37, so that dielectric deposits are formed on the various internal members.

Further, another part of the various dielectric substances is deposited on the dielectric layers $30A_1$, $30B_1$, $30B_2$ and $30C_2$ on the bottom, side and top wall sections 30A, 30B and 30C of the housing 30, so that dielectric deposits are formed thereon.

Note, similar to the case of the above-mentioned first embodiment of FIG. 3, in this specification, each of the bottom, side and top wall sections 30A, 30B and 30C of the housing 30 is defined as an internal member. Also, note that titanium fluoride ($TiF_3$) forms a main component of the dielectric deposits formed on the internal members.

In the third embodiment of FIG. 5, the aforesaid first type dielectric material such as titanium dioxide ($TiO_2$), potassium dihydrogenphosphate ($KH_2PO_4$), barium zirconate ($PbZrO_3$) or the like is selected so as to have a larger m(d∈/dm) value than that the dielectric deposits deposited on the internal members. On the other hand, the aforesaid second type dielectric material such as YAG, barium titanate ($BaTiO_3$), lead zirconate/titanate ($Pb(Zr,Ti)O_3$) or the like is selected so as to have a smaller m(d∈/dm) value than that the dielectric deposits deposited on the internal members.

Thus, during the etching process, i.e., during the generation of the plasma, the dielectric deposits, which are deposited on the dielectric layers $30A_1$, $30B_1$ and $30B_1'$ and the internal members 31A, 31B, 31D and 31E, are subjected to forces pressing them against these internal members, respectively, so that particles cannot be produced from theme dielectric deposits concerned. On the other hand, the dielectric deposits, which are deposited on the dielectric layers $30B_2$, $30C_2$, and $35A_2$, $36A_2$ and $37A_2$, are subjected to forces peeling them from the internal members, so that particles are produced in the processing chamber 20D.

In short, in the third embodiment of FIG. 5, the production of the particles is suppressed in a lower space of the processing chamber 30D below the guide ring member 31E, due to the pressing force exerted on the dielectric deposits, whereas the production of the particles is activated in an upper space of the processing chamber 30D above the guide ring member 31E.

If the particles are produced in the lower space of the processing chamber 30D, a part of the particles is apt to be intruded into a space between the plasma and the silicon wafer W, and thus the intruded particles are electrically attracted to the silicon wafer W which is negatively self-biased. Nevertheless, in reality, the attraction of the particles to the silicon wafer W is effectively prevented because the production of the particles is suppressed in the lower space of the processing chamber 30D.

On the other hand, similar to the above-mentioned second embodiment of FIG. 4, although the production of the particles is activated in the upper space of the processing chamber 30D, the silicon wafer W is protected from being contaminated with the particles because the particles are repelled by the plasma.

Fourth Embodiment

Figure 6:
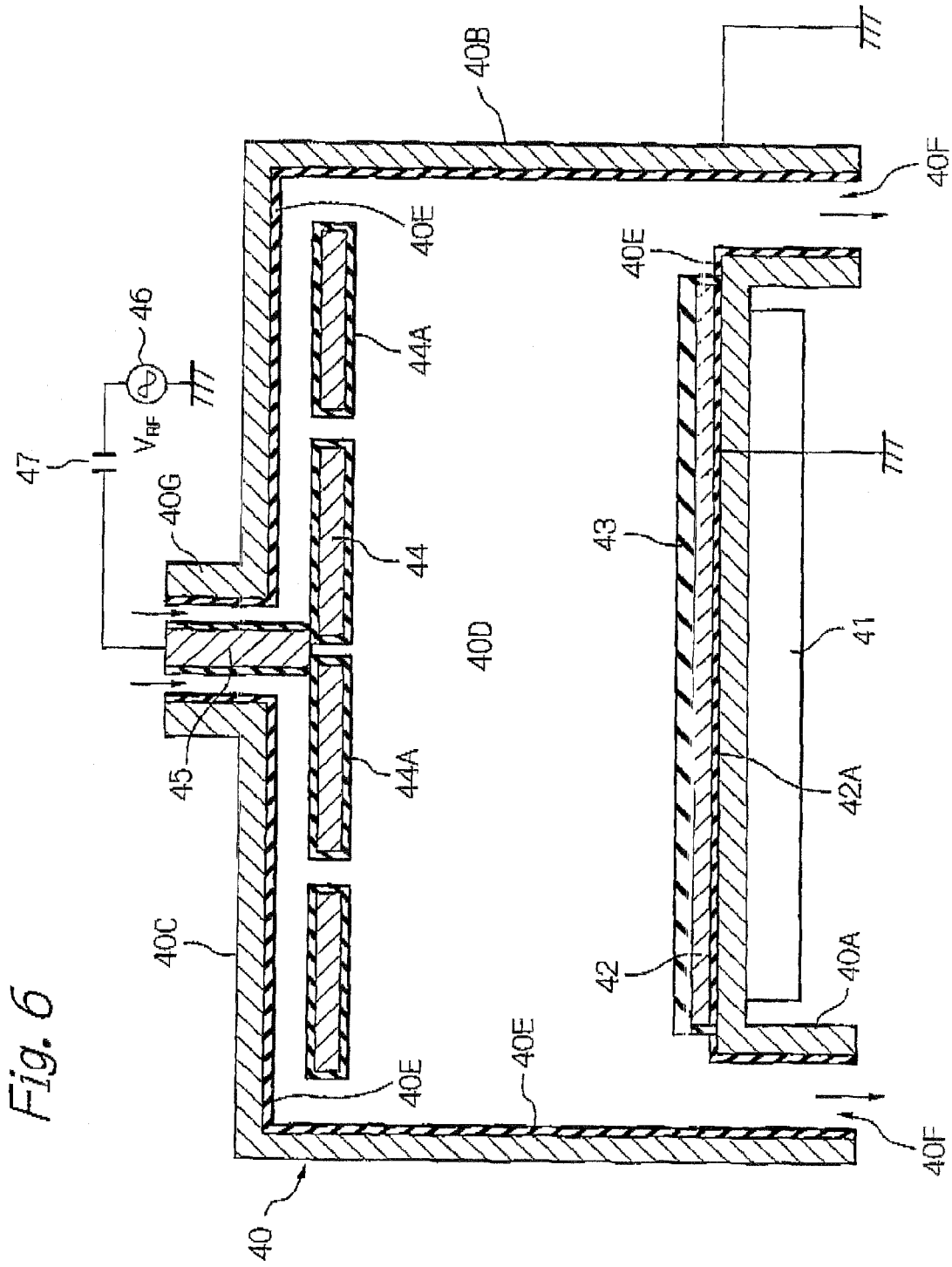
FIG. 6 is a schematic cross-sectional view of a fourth embodiment of the apparatus according to the present invention.

With reference to FIG. 6 which is a cross-sectional view of a fourth embodiment of the apparatus according to the present inventions the fourth embodiment is constituted as a thermal CVD apparatus.

The thermal CVD apparatus includes a housing 40 having a bottom wall section 40A, a side wall section 40B and a top wall section 40C which define a processing chamber 40D. The housing 40 itself is formed of a suitable metal material such as aluminum or the like, and the inner wall surfaces of the bottom, side and top wall sections 40A, 40B aid 40C of the housing 40 are coated with a suitable dielectric material, so that silicon dioxide layers 40E are formed thereon.

The housing 40 is provided with exhaust passages 40F formed in the bottom wall section 10A, and the exhaust passages 40F are in communication with a vacuum source (not shown) so that a vacuum state is created in the processing chamber 40D.

Also, the housing 40 is provided with a gas supply conduit 40G integrally provided in the top wall section 40C. When a CVD process is executed in the thermal CVD apparatus of FIG. 6, start gases for the CVD process are introduced into the processing chamber 40D through the gas supply conduit 40G. On the other hand, when the processing chamber 40D is cleaned, a cleaning gas is introduced into the processing chamber 40D through the gas supply conduit 40G.

Note, as shown in FIG. 6, the dielectric layer 40E formed on the inner surface of the top wall section 40C is extended so that an inner surface of the gas supply conduit 40G is covered with the extension thereof.

The thermal CVD apparatus of FIG. 6 also includes electric heaters 41 provided on an outer surface of the bottom wall section 40A, an lower electrode 42 provided on an inner surface of the bottom wall section 40A, and a susceptor 43 provided on the respective lower electrodes 42. Although not illustrated, an object such as a silicon wafer to be processed is placed on the susceptor 43.

The lower electrode 42 itself is formed of a suitable metal such as aluminum or the like, and both a bottom surface and a side surface of the lower electrodes 12 are coated with a suitable dielectric material so that a dielectric layer 42A is formed thereon. The dielectric material of the dielectric layer 42A may be the same as that of the dielectric layers 40E. Also, the susceptor 43 is formed of a suitable dielectric material, and the dielectric material of the susceptor 43 may be the same as that of the dielectric layers 40E.

Although not illustrated in FIG. 6, the thermal CVD apparatus may be provided with a DC power source which is connected to the lower electrodes 42 through a resistor, and which applies an ESC voltage to the lower electrodes 42 so that the silicon wafer (not shown) is electrostatically and tightly held by the susceptor 43, whereby the silicon wafer can be uniformly heated by the electric heater 41.

The thermal CVD apparatus of FIG. 6 further includes an upper electrode 44 which is suspended from the top wall section 40C of the housing 40 so as to oppose the lower electrodes 42. Namely, the upper electrode 44 is connected to a lower end of a conductive stem 45 which is extended through the gas supply conduit 40G, and which is supported by a suitable support member (not shown).

The thermal CVD apparatus of FIG. 6 is provided with an AC power source 46 which is connected to the conductive stem 45 through a capacitor 47, and an RF voltage $V_{RF}$ is applied to the upper electrode 44 so that a plasma (not shown) is generated between the lower electrodes 42 and the upper electrode 44 during the execution of the CVD process.

As shown in FIG. 6, the upper electrode 44 is suitably perforated, and thus serves as a gas plate for uniformly distributing the start gases in the processing chamber 40D. The upper electrode 44 is coated with a suitable dielectric material so that a dielectric layer 44A is formed thereon. The dielectric material of the dielectric layer 44A may be the same as that of the dielectric layers 40E.

Also, the conductive stem 45 is coated with a suitable dielectric material so that a dielectric layer 45A is formed thereon. The dielectric material of the dielectric layer 45A may be the same as that of the dielectric layers 40E.

In the thermal CVD apparatus of FIG. 6, while the CVD process is repeatedly executed, reaction products or dielectric substances, which are derived from the start gases, are deposited on various internal members such as the susceptor 43, the upper electrode 44, the conductive stem 45 and so on, so that dielectric deposits are formed thereon. Also, a part of the dielectric substances is deposited on the dielectric layers 40E on the inner wall surfaces of the bottom, side and top wall sections 40A, 40B and 40C of the housing 40, so that dielectric deposits are formed thereon.

Note, similar to the case of the above-mentioned first embodiment of FIG. 3, in this specification, each of the bottom, side and top wall sections 40A, 40B and 40C of the housing 40 is defined as an internal member.

Thus, a cleaning of the processing chamber 40D has to be periodically carried out before a proper execution of the CVD process can be ensured.

In particular, first, the aforesaid vacuum source (not shown) is driven so that a vacuum state is created in the processing chamber 40D. Then, the lower electrode 42 and the housing 40 are grounded as shown in FIG. 6, and the RF voltage is applied to the upper electrode 44 to thereby create a plasma in the processing chamber 40D. Subsequently, a suitable cleaning gas such as a perfluorocarbon gas, a perfluoroethane gas, a perfluoropropane gas, a nitrogen trifluoride gas, a carbonyl fluoride gas or the like is introduced as an etching gas into the processing chamber 40D through the gas supply conduit 40G. Namely, the cleaning of the processing chamber 40D is carried out by etching the dielectric deposits formed on the internal members.

In the fourth embodiment of FIG. 6, the dielectric material of the dielectric layers 40E, the susceptor 43, the dielectric layers 44A and 45A is selected as one having a smaller $m(d\in/dm)$ value than that of the dielectric deposits formed on the internal members. Thus, during the cleaning of the processing chamber 40D the dielectric deposits are subjected to a force peeling them from the internal members, and thus it is possible to effectively carry out the cleaning of the processing chamber 40D.

Fifth Embodiment

Figure 7:
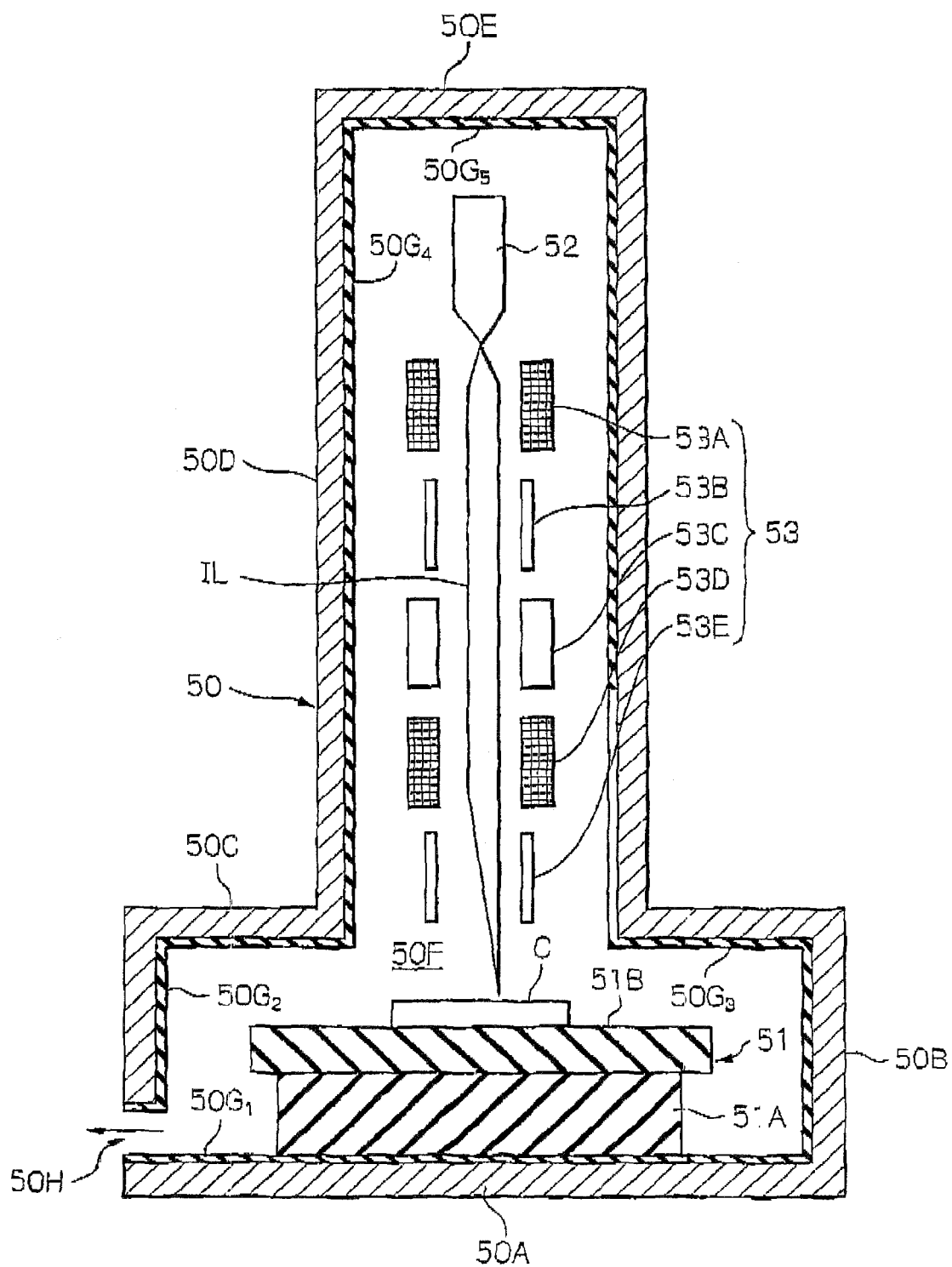
FIG. 7 is a schematic cross-sectional view of a fifth embodiment of the apparatus according to the present invention.

With reference to FIG. 7 which is a cross-sectional view of a fifth embodiment of the apparatus according to the present invention, the fifth embodiment is constituted as a focused ion beam (FIB) apparatus.

The FIB apparatus includes a housing 50 having a bottom wall section 50A, a side wall section 50B, a ceiling wall section 50C, a cylindrical wall section 50D and a top wall section 50E which define a processing chamber 50F. The housing 50 itself is formed of a suitable metal such as aluminum or the likes and inner surfaces of the wall sections 50A, 50B, 50C, 50D and 50E are coated with a suitable dielectric material so that respective dielectric layers $50G_1$, $50G_2$, $50G_3$, $50G_4$ and $50G_5$ are formed thereon.

The housing 50 is provided with an exhaust port 50H formed in the side wall section 50B, and the exhaust port 50H is in communication with a vacuum source (not shown) so that a vacuum state is created in the processing chamber 50F.

The FIB apparatus of FIG. 7 also includes an object-stage unit 51 provided on the bottom wall section 50A, and the object-stage unit 31 has a base member 51A fixed on the bottom wall section 50A, and a susceptor 51B securely mounted on the base member 51A. An object such as a semiconductor chip C to be processed is placed oil the susceptor 51B. Both the base member 51A and the susceptor 51B are formed of a suitable dielectric material. The dielectric material of both the base member 51A and the susceptor 51B may be the same as that of the dielectric layers $50G_1$, $50G_2$, $50G_3$, $50G_4$ and $50G_5$.

The FIB apparatus of FIG. 7 further includes an ion source 52 provided in the processing chamber 50F in the vicinity of the top wall section 50E, and the ion source 52 emits ions.

Although not illustrated in FIG. 7, the ion source 52 is suitably supported by support members securely attached to the cylindrical wall section 50D. If necessary, the support members are coated with the same dielectric material as that of the dielectric layers $50G_1$, $50G_2$, $50G_3$, $50G_4$ and $50G_5$.

The FIB apparatus of FIG. 7 further includes an ion beam control unit 53 provided in the space defined by the cylindrical wall section 50D. By the ion beau control unit 53, the ions emitted from the ion source 52 are shaped into an ion beam IL, and the ion beam IL is controlled so that the semiconductor chip C is irradiated with the ion beam IL. To this end, the ion beam control unit 53 includes a condenser lens 53A, a beam blanker 53B, an aligner 53C, an object lens 53D and a beam deflector 53E, which are aligned with each other between the susceptor 51 and the ion source 52.

Although not illustrated in FIG. 7, the ion beam control unit 53 is suitably supported by support members securely attached to the cylindrical wall section 50D. If necessary, the support members are coated with the same dielectric material as that of the dielectric layers $50G_1$, $50G_2$, $50G_3$, $50G_4$ and $50G_5$.

While the semiconductor chip C is irradiated with the ion beam IL, various dielectric substances are produced from the semiconductor chip C due to the sputtering effect. The dielectric substances are deposited on various internal members such as the base member 51A, the susceptor 51B the aforesaid support members and so on, so that dielectric deposits are formed thereon. Also, a part of the dielectric substances is deposited on the dielectric layers $50G_1$, $50G_2$, $50G_3$, $50G_4$ and $50G_5$ on the wall sections 50A, 50B, 50C, 50D and 50E of the housing 50, so that dielectric deposits are formed thereon.

Note, similar to the case of the above-mentioned first embodiment of FIG. 3, in this specification, each of the wall sections 50A, 50B, 50C, 50D and 50E of the housing 50 is defined as an internal member.

Electric fields are generated in the processing chamber 50F by both the ion source 52 and the ion control unit 53, and thus the dielectric deposits are subjected to the Helmholtz stress.

In the fifth embodiment of FIG. 7, the dielectric layers $50G_1$, $50G_2$, $50G_3$, $50G_4$ and $50G_5$ have an $m(d\in/dm)$ value which is substantially equal to that of the dielectric deposits formed on the internal members, so that it is possible to suppress production of particles from the dielectric deposits, whereby the semiconductor chip C can be protected from being contaminated with the particles.

Sixth Embodiment

Figure 8:
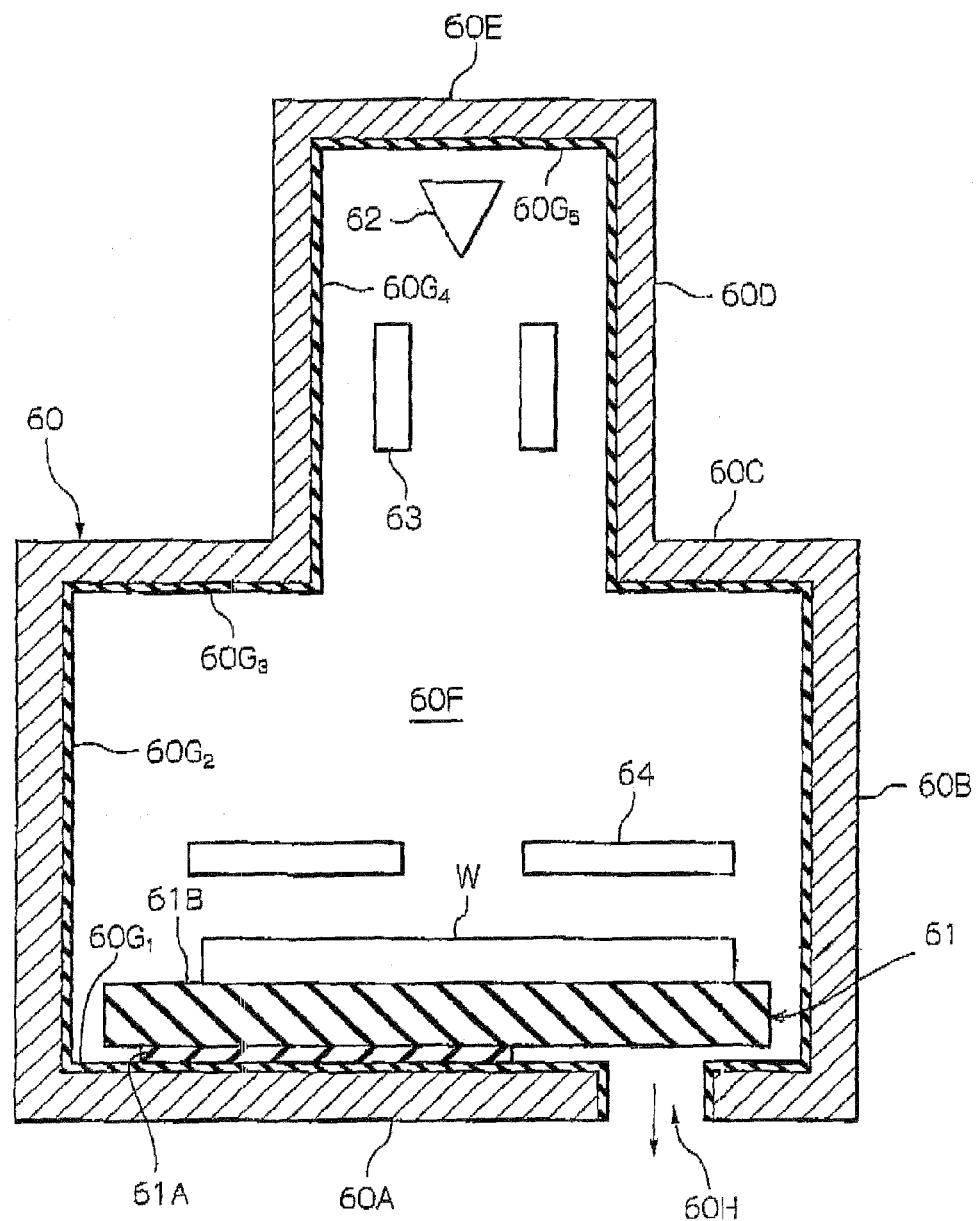
FIG. 8 is a schematic cross-sectional view of a fifth embodiment of the apparatus according to the present invention.

With reference to FIG. 8 which is a cross-sectional view of a sixth embodiment of the apparatus according to the present invention, the sixth embodiment is constituted as an electron beam (EB) exposure apparatus.

The EB apparatus includes a housing 60 having a bottom wall section 60A, a side wall section 60B, a ceiling wall section 60C, a cylindrical wall section 60D and a top wall section 60E which define a processing chamber 60F. The housing 60 itself is formed of a suitable metal such as aluminum or the like, and inner surfaces of the wall sections 60A, 60B, 60C, 60D and 60E are coated with a suitable dielectric material so that respective dielectric layers $60G_1$, $60G_2$, $60G_3$, $60G_4$ and $60G_5$ are formed thereon.

The housing 60 is provided with an exhaust port 60H formed in the bottom wall section 60A, and the exhaust port 60H is in communication with a vacuum source (not shown) so that a vacuum state is created in the processing chamber 60F.

The EB exposure apparatus of FIG. 8 also includes an object-stage unit 61 provided on the bottom wall section 60A, and the object-stage unit 31 has a base member 61A fixed on the bottom wall section 60A, and an object stage 61B securely mounted on the base member 61A. An object such as a silicon wafer W to be subjected to an exposure process is placed on the object stage 61B. Namely, the silicon wafer W has a photoresist layer to be exposed. Both the base member 61A and the object stage 61B are formed of a suitable dielectric material. The dielectric material of both the base member 61A and the object stage 61B may be the same as that of the dielectric layers $60G_1$, $60G_2$, $60G_3$, $60G_4$ and $60G_5$.

The EB exposure apparatus of FIG. 8 further includes an electron gun 62 provided in the processing chamber 60F in the vicinity of the top wall section 60E, and the electron gum 62 emits an electron beam toward the silicon wafer W.

Although not illustrated in FIG. 8, this electron gun 62 is suitably supported by support members securely attached to the cylindrical wall section 60D. If necessary, the support members are coated with the same dielectric material as that of the dielectric layers $60G_1$, $60G_2$, $60G_3$, $60G_4$ and $60G_5$.

The EB exposure apparatus of FIG. 8 further includes an electric field lens 63 provided in the processing chamber 60F in the vicinity of the electron gun 62, aid an electric field lens 64 provided in the processing chamber 60F in the vicinity of the object-stage unit 61. By the electric field lenses 63 and 64, the electron beam is controlled so that the silicon wafer W is scanned with the electron beam, whereby the photoresist layer on the silicon wafer W is exposed with the scanning electron beam.

Although not illustrated in FIG. 8, the electric field lens 63 is suitably supported by support members securely attached to the cylindrical wall section 60D, and the electric field lens 64 is suitably supported by support members securely attached to the side wall section 60B. If necessary, the support members are coated with the same dielectric material as that of the dielectric layers $60G_1$, $60G_2$, $60G_3$, $60G_4$ and $60G_5$.

During the exposure process, although the processing chamber 60F is in the vacuum state, some fine substances containing carbon (C), which are derived from tire photoresist layer on the silicon wafer W, inevitably exist in the processing chamber 60F.

Thus, a part of the fine substances are deposited on various internal members such as the base member 61A, the object stage 61B, the aforesaid support members and so on, so that dielectric deposits are formed thereon.

Also, another part of the dielectric substances is deposited on the dielectric layers dielectric layers $60G_1$, $60G_2$, $60G_3$, $60G_4$ and $60G_5$ of the wall sections 60A, 60B, 60C, 60D and 60E of the housing 60, so that dielectric deposits are formed thereon.

Note, similar to the case of the above-mentioned first embodiment of FIG. 3, in this specification, each of the wall sections 60A, 60B, 60C, 60D and 60E of the housing 60 is defined as an internal member.

Electric fields are generated in the processing chamber 60F by the electric field lenses 63 and 64. Thus, as stated hereinbefore, the dielectric deposits on the internal members are subjected to the following force F:

$$F=(\tfrac{1}{2})E^2[\nabla(m(d\in/dm))-\nabla\in]$$

In the sixth embodiment of FIG. 8, the dielectric material of the dielectric layers $60G_1$, $60G_2$, $60G_3$, $60G_4$ and $60G_5$, the base member 61A, the object stage 61B, the aforesaid support members and so on is selected so as to have an $m(d\in/dm)$ value which is larger than that of the dielectric deposits formed on the internal members, so that the dielectric deposits are pressed against the internal members during the exposure process. For example, for the dielectric material, titanium dioxide ($TiO_2$) may be used. Thus, it is possible to considerably suppress production of particles from the dielectric deposits in the processing chamber 60F, whereby the photoresist layer on the silicon wafer W can be protected from being contaminated with the particles.

When the exposure process is finished, i.e., when the electric fields disappear, particles may be produced from the dielectric deposits because the dielectric deposits are released from the pressing force. Although the photoresist layer on the silicon wafer W is contaminated with the particles after the exposure process, the contamination itself is minor because the particles can be eliminated from the photoresist layer during a development process of the photoresist layer.

Seventh Embodiment

Figure 9:
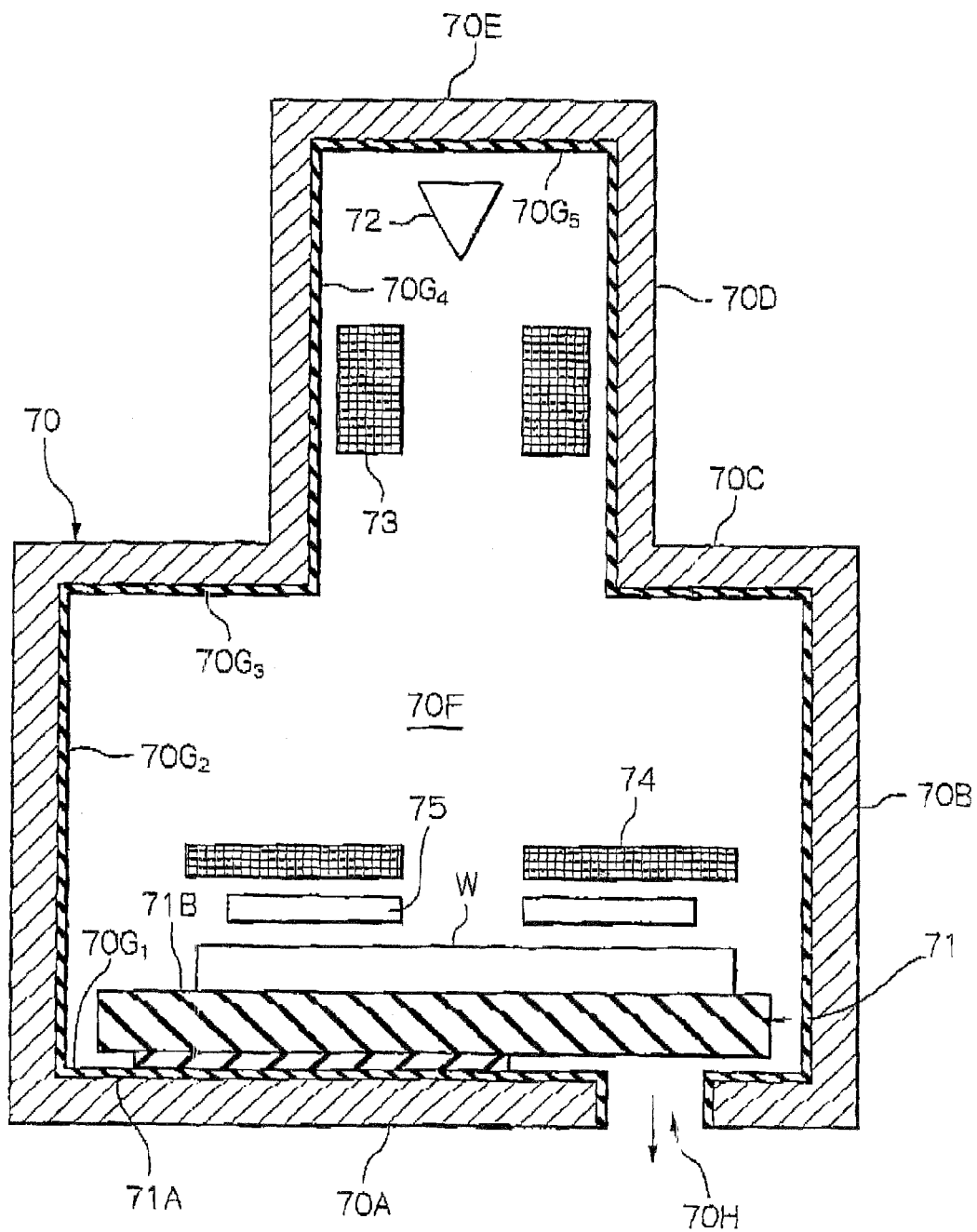
FIG. 9 is a schematic cross-sectional view of a seventh embodiment of the apparatus according to the present invention.

With reference to FIG. 9 which is a cross-sectional view of a seventh embodiment of the apparatus according to the present invention, the seventh embodiment is constituted as an electron microscopic apparatus.

The electron microscopic apparatus of FIG. 9 includes a housing 70 having a bottom wall section 70A, a side wall section 70B, a ceiling wall section 70C, a cylindrical wall section 70D and a top wall section 70E which define a processing chamber 70F. The housing 70 itself is formed of a suitable metal such as aluminum or the like, and inner surfaces of the wall sections 70A, 70B, 70C, 70D and 70E are coated with a suitable magnetic material so that respective magnetic layers $70G_1$, $70G_2$, $70G_3$, $70G_4$ and $70G_5$ are formed thereon.

The housing 70 is provided with an exhaust port 70H formed in the bottom wall section 70A, and the exhaust port 70H is in communication with a vacuum source (not shown) so that a vacuum state is created in the processing, chamber 70F.

The electron microscopic apparatus of FIG. 9 also includes an object-stage unit 71 provided on the bottom wall section 70A, and the object-stage unit 31 has a base member 71A fixed on the bottom wall section 70A, and all object stage 71B securely mounted on the base member 71A. An object such as a silicon wafer W to be observed is placed on the object stage 71B. Both the base member 71A and the object stage 71B are formed of a suitable magnetic material. The magnetic material of both the base member 71A and the object stage 71B may be the same as that of the magnetic layers $70G_1$, $70G_2$, $70G_3$, $70G_4$ and $70G_5$.

The electron microscopic apparatus of FIG. 9 further includes an electron gun 72 provided in the processing chamber 70F in the vicinity of the top wall section 70E, and the electron gum 72 emits an electron beam toward the silicon wafer W.

Although not illustrated in FIG. 9, the electron gun 72 is suitably supported by support members securely attached to the cylindrical wall section 70D. If necessary, the support members are coated with the same magnetic material as that of the magnetic layers $70G_1$, $70G_2$, $70G_3$, $70G_4$ and $70G_5$.

The electron microscopic apparatus of FIG. 9 further includes an electromagnetic lens 73 provided in the processing chamber 70F in the vicinity of the electron gun 72, and an electromagnetic lens 74 provided in the processing chamber 70F in the vicinity of the object-stage unit 71. By the electromagnetic lenses 73 and 74, the electron beam is controlled so that the silicon wafer W is scanned with the electron beam, and secondary electrons are generated from the silicon wafer W during the scanning of silicon wafer W with the electron beam.

Although not illustrated in FIG. 9, the electromagnetic lens 73 is suitably supported by support members securely attached to the cylindrical wall section 70D, and the electromagnetic lens 74 is suitably supported by support members securely attached to the side wall section 70B. If necessary, the support members are coated with the same magnetic material as that of the magnetic layers $70G_1$, $70G_2$, $70G_3$, $70G_4$ and $70G_5$.

The electron microscopic apparatus of FIG. 9 further includes a secondary electron detector 75 which is provided beneath the electromagnetic lens 74 to detect the secondary electrons generated from the silicon wafer W.

Although not illustrated in FIG. 9, the secondary electron detector 75 is suitably supported by support members securely attached to the side wall section 70B. If necessary, the support members are coated with the same magnetic material as that of the magnetic layers $70G_1$, $70G_2$, $70G_3$, $70G_4$ and $70G_5$.

In operation, although the processing chamber 70F is in the vacuum state, some fine magnetic substances, which may be derived from the silicon wafer W, inevitable exist in the processing chamber 70F.

A part of the fine substances are deposited on various internal members such as the base member 71A, the object stage 71B, the aforesaid support members and so on, so that magnetic deposits are formed thereon.

Also, another part of the magnetic substances is deposited on the magnetic layers $70G_1$, $70G_2$, $70G_3$, $70G_4$ and $70G_5$ of the wall sections 70A, 70B, 70C, 70D and 70E of the housing 70, so that magnetic deposits are formed thereon.

Note, similar to the case of the above-mentioned first embodiment of FIG. 3, in this specification, each of the wall sections 70A, 70B, 70C, 70D and 70E of the housing 70 is defined as an internal member.

Magnetic fields are generated in the processing chamber 70F by the electromagnetic lenses 73 and 74. Thus, the magnetic deposits are subjected to the following force F':

$$F' = (\tfrac{1}{2})H^2[\nabla(m(d\mu/dm)) - \nabla\mu]$$

wherein H is a strength of a magnetic field, and ì is a permeability of the magnetic deposit.

In the seventh embodiment of FIG. 9, the magnetic layers $70G_1$, $70G_2$, $70G_3$, $70G_4$ and $70G_5$ have an m(dμ/dm) value which is substantially equal to that of the magnetic deposits formed on the internal members. Thus, not only can production of particles from the magnetic deposits can be suppressed during the operation, but also it is possible to suppress the production of the particles when the magnetic fields are generated or when the magnetic fields disappear, because neither the peeling force nor the pressing force is exerted on the magnetic deposits formed on the internal members.

Eighth Embodiment

Figure 10:
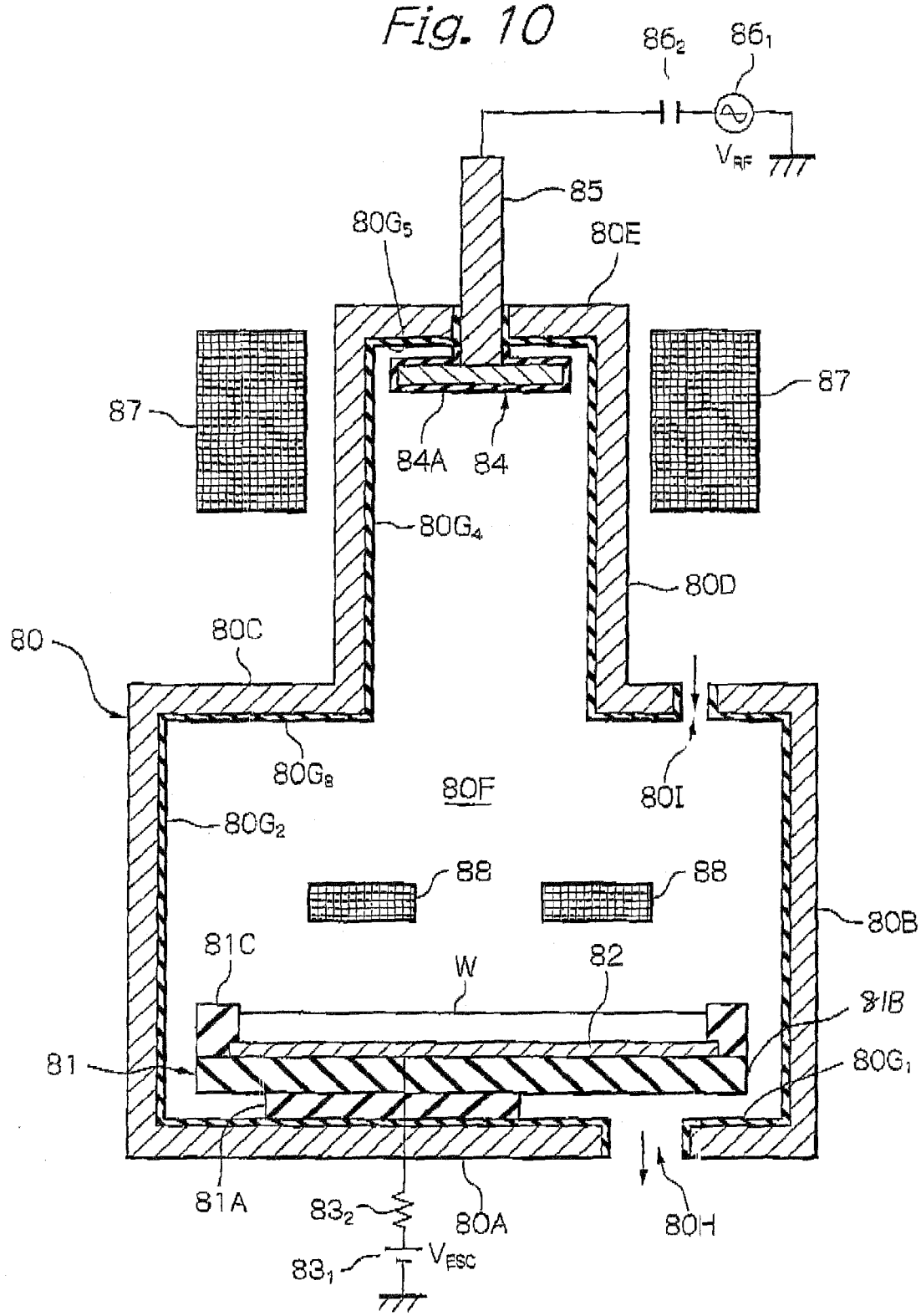
FIG. 10 is a schematic cross-sectional view of an eighth embodiment of the apparatus according to the present invention.

With reference to FIG. 10 which is a cross-sectional view of an eighth embodiment of the apparatus according to the present invention, the eighth embodiment is constituted as an electron cyclotron resonance (ECR) type plasma etching apparatus.

The ECR type plasma etching apparatus includes a housing 80 having a bottom wall section 80A, a side wall section 80B, a ceiling wall section 80C, a cylindrical wall section 80D and a top wall section 80E which define a processing chamber 80F. The housing 80 itself is formed of a suitable metal such as aluminum or the like, and inner surfaces of the wall sections 80A, 80B, 80C, 80D and 80E are coated with a suitable-table magnetic material so that respective magnetic layers $80G_1$, $80G_2$, $80G_3$, $80G_4$ and $80G_5$ are formed thereon.

The housing 80 is provided with an exhaust port 80H formed in the bottom wall section 80A, and the exhaust port 80H is in communication with a vacuum source not shown) so that a vacuum state is created in the processing chamber 80F. Also, the housing 80 is provided with a gas supply port 80I formed in the ceiling wall section 80C, and the gas supply port 80I is in communication with an etching gas source (not shown) so that an etching gas is introduced into the processing chamber 80F through the gas supply part 80I.

The ECR type plasma etching apparatus of FIG. 10 also includes an object-stage unit 81 provided on the bottom wall section 80A, and a lower electrode 82 incorporated in the object-stage unit 81.

In particular, the object-stage unit 81 has a base member 81A fixed on the bottom wall section 81A, an object stage member 81B securely mounted on the base member 81A, and a guide ring member 81C securely mounted on that object stage member 81B. The lower electrode 82 is provided on the object so stage member 80B, and is retained by the guide ring member 81C. An object such as a silicon wafer W to be processed is placed on the lower electrode, and is positioned in plaice on the lower electrode 32 by the guide ring member 81C.

The ECR type plasma etching apparatus of FIG. 10 is provided with a DC power source $83_1$ which is connected to the lower electrodes 82 through a resistor $83_2$, and which applies an ESC voltage $V_{ESC}$ to the lower electrodes 82 so that the silicon wafers W are electrostatically and tightly held by the lower electrode 82.

The ECR type plasma etching apparatus of FIG. 10 also includes an upper electrode 84 which is suspended from the top wall section 80E or the housing 80 so as to oppose the lower electrodes 82. Namely, the upper electrode 84 is connected to a lower end of a conductive stem 85 which is securely set in the top wall section 80E. The upper electrode 84 is coated with a suitable magnetic material so that a magnetic layer 84A is formed thereon.

The ECR type plasma etching apparatus of FIG. 10 is provided with an AC power source $86_1$ which is connected to the conductive stem 85 through a capacitor $86_2$, and an RF voltage $V_{RF}$ is applied to the upper electrode 84 so that a plasma (not shown) is generated between the lower electrodes 82 and the upper electrode 84. During the generation of the plasma, the silicon wafer W captures electrons so that the lower electrode 82 with the silicon wafers W is negatively self-biased. Namely, the lower electrode 82 with the silicon wafer W serves as a cathode electrode, and the upper electrode 84 serves as an anode electrode.

In order to facilitate the generation if the plasma, the ECR type plasma etching apparatus of FIG. 10 further includes an outer electromagnet 87 provided at around the cylindrical wall section 80D, and an inner electromagnet 88 provided in the processing chamber 80F just alcove the object-stage unit 81, to thereby generate a magnetic field in the processing chamber 80F. For example, the magnetic field has a magnetic flux density on the order of several hundred Gs.

During an etching process, various magnetic substances may be produced as reaction produces in the processing chamber 80F.

A part of the various magnetic substances is deposited on various internal members such as the base member 81A, the object stage 81B, the guide ring 81C, the upper electrode 84, so that magnetic deposits are formed on the various internal members.

Also, another part of the various magnetic substances is deposited on the magnetic layers $80G_1$, $80G_2$, $80G_3$, $80G_4$ and $80G_5$ on the inner wall surfaces of the wall sections 80A, 80B, 80C, 80D and 80E of the housing 80, so that magnetic deposits are formed thereon.

Note, similar to the case of the above-mentioned first embodiment of FIG. 3, in this specification, each of the wall sections 80A, 80B, 80C, 80D and 80E of the housing 80 is defined as an internal members.

In the eighth embodiment of FIG. 10, the magnetic deposits formed on the internal members are dominated by the magnetic field rather than the electric field due to the magnetic flux density on the order of several hundred Gs. Also, the magnetic layers $80G_1$, $80G_2$, $80G_3$, $80G_4$, and $80G_5$, the internal members 81A, 81B and 81C and the magnetic layer 84A have an m(dμ/dm) value which is smaller than that of the magnetic deposits formed on the internal members.

Thus, during the etching process, the magnetic deposits are subjected to the peeling force for peeling them from the internal members, and thus the particles are actively produced. Nevertheless, the particles can be discharged from the processing chamber 80F through the exhaust port 80H in a similar manner to that of the first embodiment of FIG. 3, without the silicon wafer W being contaminated with the particles.

In the eighth embodiment of FIG. 10, preferably, the m(dμ/dm) value of the magnetic deposits is calculated based on a permeability and an expansion coefficient of the magnetic deposits actually measured. Nevertheless, the m(dμ/dm) value of the magnetic deposits may be represented by an m(dμ/dm) value of a main component of the magnetic deposits. Otherwise, the m(dμ/dm) value of the magnetic deposits may be represented lay an average of m(dμ/dm) valves of some components of the magnetic deposits.

In the eighth embodiment of FIG. 10, during the etching-process, since the particles are actively produced and discharged from the processing chamber 80D, growth of the magnetic deposits is suppressed so that it is possible to postpone periodic maintenance for cleaning the ECR type plasma etching apparatus of FIG. 10.

Ninth Embodiment

Figure 11:
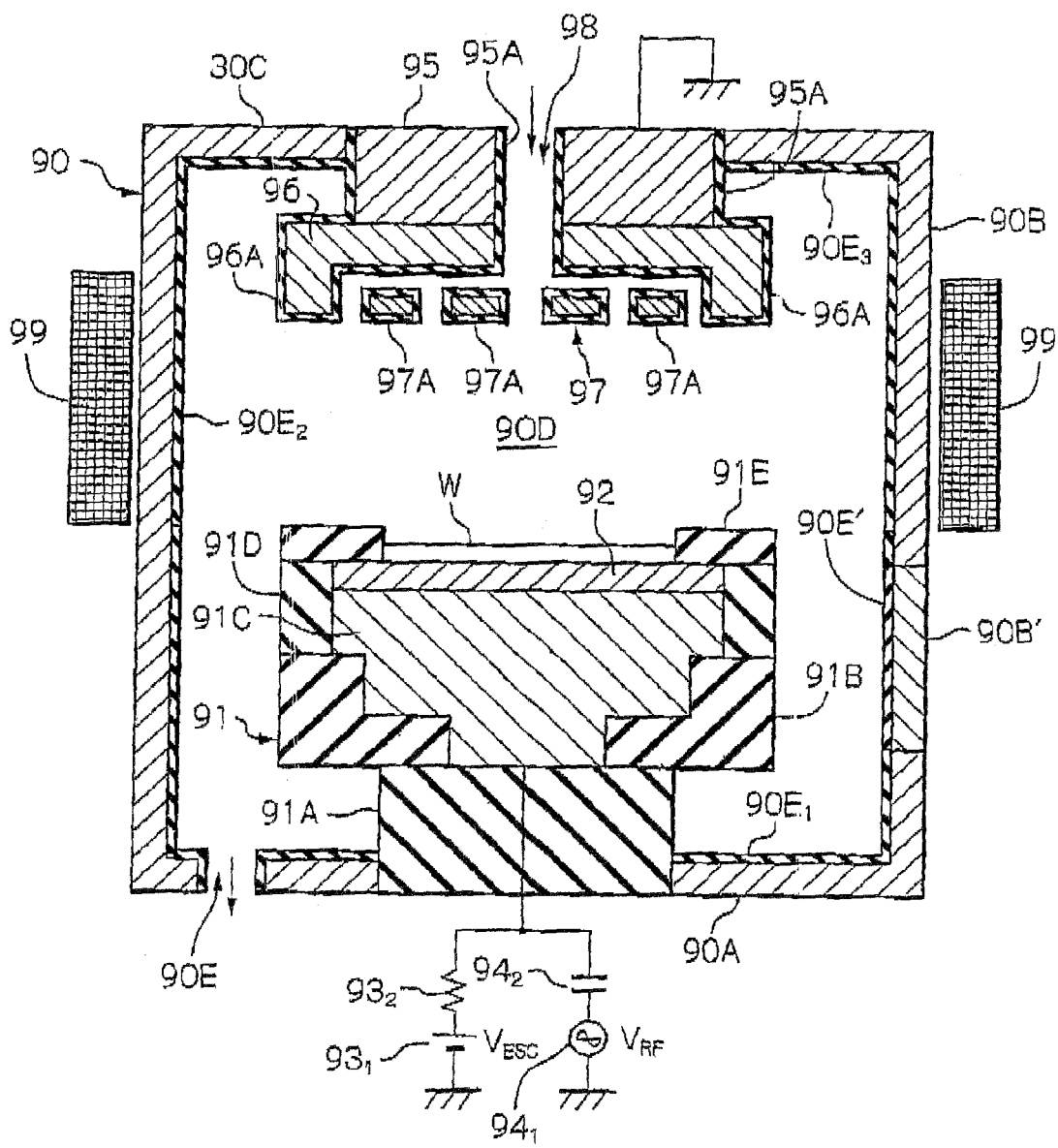
FIG. 11 is a schematic cross-sectional view of a ninth embodiment of the apparatus according to the present invention.

With reference to FIG. 11 which is a cross-sectional view of a ninth embodiment of the apparatus according to the present invention, the ninth embodiment is constituted as a magnetic-field assist type plasma etching apparatus.

The magnetic-field assist type plasma etching apparatus includes a housing 90 having a bottom wall section 90A, a side wall section 90B and a top wall section 90C which define a processing chamber 90D. The housing 90 itself is formed of a suitable metal material such as aluminum or the like. The inner surfaces of the bottom, side and top wall sections 90A, 90B and 90C are coated with a suitable magnetic material so that magnetic layers $90E_1$, $90E_2$ and $90E_3$ are formed thereon.

The side wall section 90B is provided with a gate valve 90B' which is openable for introducing an object such as a silicon wafer W to be processed into the processing chamber 90D and for taking out the same from the processing chamber 90D. The inner wall surface of the gate valve 90B' is coated with a suitable magnetic material so that a magnetic layer 90E' is formed therein. The magnetic material of the magnetic layer 90E' may be the same as that of the magnetic layers $90E_1$, $90E_2$ and $90E_3$.

The housing 90 is provided with an exhaust port 90E formed in the bottom wall section 90A, and the exhaust port 90E is in communication with a vacuum source snot shown) so that a vacuum state is created in the processing chamber 90D.

Also, the magnetic-field assist type plasma etching apparatus of FIG. 11 includes an object-stage unit 91 provided in the bottom wall section 90A, and a lower electrode 92 incorporated in the object-stage unit 91, and the silicon wafer W to be processed is placed on the lower electrode 92.

In particular, the object-stage unit 91 has a base member 91A set in the bottom wall section 90A, a cup-like member 91B securely mounted on the base member 91A, a conductive member 91C received in the cup-like member 91B, a ring-like member 91D securely mounted on the cup-like member 91B so as to surround an upper portion of the conductive member 91C, and a guide ring member 91E securely mounted on the ring-like member 91D. The lower electrode 92 is provided on the conductive member 91C, and is retained by the guide ring member 91E to thereby position the silicon wafer W in place on the lower electrode 92.

The base member 91A, the cup-like member 91B, the ring-like member 91D and the guide ring member 91E are formed of a suitable magnetic material. The magnetic material of the base member 91A, the cup-like member 91B, the ring-like member 91D and the guide ring member 91E may be the same as that of the magnetic layers $90E_1$, $90E_2$, and $90E_3$.

The magnetic-field assist type plasma etching apparatus of FIG. 11 is provided with a DC power source $93_1$ which is connected to the conductive member 90C through a resistor $93_2$ so that an ESC voltage $V_{ESC}$ is applied to the lower electrode 92 through the conductive member 91C, whereby the silicon wafer W is electrostatically and tightly held by the lower electrode 92.

Also, the magnetic-field assist type plasma etching apparatus of FIG. 11 is provided with an AC power source $94_1$ which is connected to the conductive member 91C through a capacitor $94_2$, end an RF voltage $V_{RF}$ is applied to the lower electrode 92.

The magnetic-field assist type plasma etching apparatus of FIG. 11 further includes a conductive plug-like member 95 set in the top wall section 90C of the housing 90, an upper electrode 96 securely attached to the lower end face of the conductive plug-like member 95, and a as plate 97 electrically and securely connected to the upper electrode 96.

The upper electrode 96 is grounded through the plug-like conductive member 95, and thus a plasma (not shown) is generated between the lower and upper electrodes 92 and 96 when applying the RF voltage $V_{RF}$ to the lower electrode 92. At this time, the lower and upper electrodes 92 and 96 serve as cathode and anode electrodes, respectively.

Both the plug-like member 95 and the upper electrode 96 are formed with a gas supply passage 98 at the centers thereof, and a suitable etching gas is introduced into the processing chamber 90D through the gas supply passage 98.

The plug-like member 95, the upper electrode 96 and the gas plate 97 are formed of a suitable metal material such as aluminum or the like, and are also coated with a suitable magnetic material, so that magnetic layers 95A, 96A and 97A are formed thereon, whereby the metal surface of the plug-like member 95, the upper electrode 96 and the gas plate 97 are prevented from being directly exposed.

In order to assist the generation of the plasma, the magnetic-field assist type plasma etching apparatus of FIG. 11 further includes an outer electromagnet 99 provided around the side wall section 90B, and the magnetic field generated by the outer electromagnet 99 is superior to an electric field generated by the lower and upper electrodes 92 and 96.

During an etching process, various magnetic substances may be produced as reaction products in the processing chamber 90D.

A part of the various magnetic substances is deposited on various internal members such as the base member 91A, the cup-like member 91B, the ring-like member 91D and the guide ring member 91E, so that magnetic deposits are formed on the various internal members.

Also, another part of the various magnetic substances is deposited on the magnetic layers $90E_1$, $90E_2$ and $90E_3$ on the inner wall surfaces of the wall sections 90A, 90B and 80C of the housing 90, so that magnetic deposits are formed thereon.

Note, similar to the case of the above-mentioned first embodiment of FIG. 3, in this specification, each of the bottom, side and top wall sections 90A, 90B and 80C of line housing 90 is defined as an internal member.

In the ninth embodiment of FIG. 11 the magnetic deposits formed on the internal members are dominated by the magnetic field rather than the electric field due to that fact that the magnetic field generated by the outer electromagnet 99 is superior to the electric field generate by the lower and upper electrodes 92 and 96. Also, the magnetic layers $90E_1$, $90E_2$ and $90E_3$, the internal members 91A, 91B, 91D and 91E and the magnetic layers 96A and 97A have an m(dμ/dm) value which is larger than that of the magnetic deposits formed on the internal members.

Thus, during the etching process, the magnetic deposits are subjected to the pressing force for pressing them against the internal members, and thus it is possible to effectively suppress the production of the particles.

In the ninth embodiment of FIG. 11, preferably, the m(dμ/dm) value of the magnetic deposits is calculated based on a permeability and an expansion coefficient of the magnetic deposits actually measured. Nevertheless, the m(dμ/dm) value of the magnetic deposits may be represented by an m(dμ/dm) value of a main component of the magnetic deposits. Otherwise, the m(dμ/dm) value of the magnetic deposits may be represented by an average of m(dμ/dm) values of some components of the magnetic deposits.

Finally, it will be understood by those skilled in the art that the foregoing description is of preferred embodiments of the method, and that various changes and modifications may be made to the present invention without departing from the spirit and scope thereof.

The invention claimed is:

1. An apparatus, comprising:
a housing defining a chamber having a gas inlet and outlet in which an electric field is generated by upper and lower electrodes; and an internal ring-shaped member provided in said chamber, wherein at least one part of said internal ring-shaped member, every sidewall portion of the chamber, and said gas inlet and outlet are formed of a first dielectric material,
wherein said electric field causes formation of a second dielectric deposit on the first dielectric material on the at least one part of said internal ring-shaped member including the sidewall portions, such that an $m_1(d\in_1/dm_1)$ value of said first dielectric material and an $m_2(d\in_2/dm_2)$ value of said second dielectric deposit are different from each other and are set so that production of particles from said second dielectric deposit is controlled, $m_1$ being a mass density of said first dielectric material, $\in_1$ being a permittivity of said first dielectric material, $m_2$ being a mass density of said second dielectric deposit, and $\in_2$ being a permittivity of said second dielectric deposit,
wherein the internal ring-shaped member is provided to position a wafer on the lower electrode or is provided surrounding the upper electrode.

2. The apparatus as set forth in claim 1, wherein a difference between the $m_1(d\in_1/dm_1)$ value of said first dielectric material and the $m_2(d\in_2/dm_2)$ value of said second dielectric deposit falls within a range of ±5%.

3. The apparatus as set forth in claim 1, wherein the $m_1(d\in_1/dm_1)$ value of said first dielectric material is larger than the $m_2(d\in_2/dm_2)$ value of said second dielectric deposit.

4. The apparatus as set forth in claim 1, wherein the $m_1(d\in_1/dm_1)$ value of said first dielectric material is smaller than the $m_2(d\in_2/dm_2)$ value of said second dielectric deposit.

5. The apparatus as set forth in claim 1, wherein a difference between the $m_1(d\in_1/dm_1)$ value of said first dielectric material is within a range of ±5% the $m_2(d\in_2/dm_2)$ value of said second dielectric deposit when said apparatus is constituted as either a plasma chemical vapor deposition apparatus or a focused ion beam apparatus.

6. The apparatus as set forth in claim 5, wherein said first dielectric material is either titanium dioxide ($TiO_2$) or yttrium aluminum garnet (YAG).

7. The apparatus as set forth in claim 1, wherein the $m_1(d\in_1/dm_1)$ value of said first dielectric material is smaller than the $m_2(d\in_2/dm_2)$ value of said second dielectric deposit when said apparatus is constituted as either a plasma etching apparatus or a thermal chemical vapor deposition apparatus.

8. The apparatus as set forth in claim 7, wherein said first dielectric material is one selected from the group consisting of yttrium aluminum garnet (YAG), barium titanate ($BaTiO_3$) and lead zirconate/titanate ($Pb(Zr,Ti)O_3$).

9. The apparatus as set forth in claim 1, wherein the $m_1(d\varepsilon_1/dm_1)$ value of said first dielectric material is larger than the $m_2(d\varepsilon_2/dm_2)$ value of said second dielectric deposit when said apparatus is constituted as a plasma etching apparatus, and when said internal member is positioned beneath said plasma.

10. The apparatus as set forth in claim 9, wherein said first dielectric material is one selected from the group consisting of titanium dioxide ($TiO_2$), potassium dihydrogenphosphate ($KH_2PO_4$) and lead zirconate ($PbZrO_3$).

11. The apparatus as set forth in claim 1, wherein the $m_1(d\varepsilon_1/dm_1)$ value of said first dielectric material is larger than the $m_2(d\varepsilon_2/dm_2)$ value of said second dielectric deposit when said apparatus is constituted as an electron beam exposure apparatus.

12. The apparatus as set forth in claim 11, wherein said first dielectric material is titanium dioxide ($TiO_2$).

13. The apparatus as set forth in claim 1, wherein said second dielectric deposit contains a plurality of components, and wherein the $m_2(d\varepsilon_2/dm_2)$ value of said first dielectric deposit is represented by that of a main one of said components.

14. The apparatus as set forth in claim 1, wherein said second dielectric deposit contains a plurality of components, and wherein the $m_2(d\varepsilon_2/dm_2)$ value of said first dielectric deposit is represented by an average of those of said components.

15. An apparatus, comprising:
a housing defining a chamber having a gas inlet and outlet in which a magnetic field is generated at a first portion thereof and focused at a second portion thereof opposite to the first portion; and an internal member provided in said chamber, wherein said internal member, every sidewall portion of the chamber, and said gas inlet and outlet are formed of a first magnetic material,
wherein said magnetic field causes formation of a second magnetic deposit on the first magnetic material on said internal member including the sidewall portions, such that an $m_1(d\mu_1/dm_1)$ value of said first magnetic material and an $m_2(d\mu_2/dm_2)$ value of said second magnetic deposit are different from each other and are set so that production of particles from said first magnetic deposit is controlled, $m_1$ being a mass density of said first magnetic material, $\mu_1$ being a permeability of the first magnetic material, $m_2$ being a mass density of said second magnetic deposit, and $\mu_2$ being a permittivity of said second magnetic deposit.

16. The apparatus as set forth in claim 15, wherein a difference between the $m_1(d\mu_1/dm_1)$ value of said first magnetic material and the $m_2(d\mu_2/dm_2)$ value of said second magnetic deposit falls within a range of ±5%.

17. The apparatus as set forth in claim 15, wherein the $m_1(d\mu_1/dm_1)$ value of said first magnetic material is larger than the $m_2(d\mu_2/dm_2)$ value of said second magnetic deposit when said apparatus is constituted as a magnetic-field assist type plasma etching apparatus.

18. The apparatus as set forth in claim 15, wherein the $m_1(d\mu_1/dm_1)$ value of said first magnetic material is smaller than the $m_2(d\mu_2/dm_2)$ value of said second magnetic deposit when said apparatus is constituted as an electron cyclotron resonance type plasma etching apparatus.

19. The apparatus as set forth in claim 15, wherein said second magnetic deposit contains a plurality of components, and wherein the $m_2(d\mu_2/dm_2)$ value of said second magnetic deposit is represented by that of a main one of said components.

20. The apparatus as set forth in claim 15, wherein said second magnetic deposit contains a plurality of components, and wherein the $m_2(d\mu_2/dm_2)$ value of said second magnetic deposit is represented by an average of those of said components.

* * * * *